(12) United States Patent
Mimura et al.

(10) Patent No.: US 7,914,968 B2
(45) Date of Patent: Mar. 29, 2011

(54) POSITIVE RESIST COMPOSITION AND METHOD OF FORMING RESIST PATTERN

(75) Inventors: Takeyoshi Mimura, Kawasaki (JP); Akiya Kawaue, Kawasaki (JP); Ryoichi Takasu, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 272 days.

(21) Appl. No.: 12/374,474
(22) PCT Filed: Jun. 8, 2007
(86) PCT No.: PCT/JP2007/061648
§ 371 (c)(1),
(2), (4) Date: Jan. 20, 2009
(87) PCT Pub. No.: WO2008/012999
PCT Pub. Date: Jan. 31, 2008

(65) Prior Publication Data
US 2010/0304289 A1    Dec. 2, 2010

(30) Foreign Application Priority Data

Jul. 24, 2006  (JP) ................. 2006-201008
Jul. 26, 2006  (JP) ................. 2006-203629
Jul. 26, 2006  (JP) ................. 2006-203630

(51) Int. Cl.
*G03F 7/004* (2006.01)
*G03F 7/30* (2006.01)
(52) U.S. Cl. ............ 430/270.1; 430/326; 430/905; 430/910
(58) Field of Classification Search .......... 430/270.1, 430/326, 905, 910
See application file for complete search history.

(56) References Cited

U.S. PATENT DOCUMENTS

| 5,688,628 | A | 11/1997 | Oie et al. | |
| 5,945,517 | A | 8/1999 | Nitta et al. | |
| 6,153,733 | A | 11/2000 | Yukawa et al. | |
| 6,492,086 | B1* | 12/2002 | Barclay et al. | 430/270.1 |
| 7,202,010 | B2* | 4/2007 | Yamada et al. | 430/270.1 |
| 7,323,287 | B2 | 1/2008 | Iwai et al. | |
| 7,645,559 | B2* | 1/2010 | Watanabe et al. | 430/270.1 |
| 7,666,569 | B2* | 2/2010 | Sato et al. | 430/270.1 |
| 7,709,179 | B2* | 5/2010 | Iwashita | 430/270.1 |
| 7,803,512 | B2* | 9/2010 | Kinoshita et al. | 430/270.1 |
| 2003/0099900 | A1* | 5/2003 | Yamada et al. | 430/270.1 |
| 2007/0269744 | A1 | 11/2007 | Hada et al. | |

FOREIGN PATENT DOCUMENTS

| JP | H07-181680 | 7/1995 |
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2002-341538 | 11/2002 |
| JP | 2003-241385 | 8/2003 |
| JP | 2006-78760 | 3/2006 |
| JP | 2006-169319 | 6/2006 |
| WO | WO 2004-074242 | 9/2004 |

OTHER PUBLICATIONS

International Search report issued on Jul. 3, 2007 in the corresponding PCT application No. PCT/JP2007/061648.

* cited by examiner

*Primary Examiner* — John S Chu
(74) *Attorney, Agent, or Firm* — Knobbe, Martens, Olson & Bear, LLP

(57) ABSTRACT

A positive resist composition including a resin component (A) and an acid-generator component (B), the resin component (A) including a structural unit (a1) derived from hydroxystyrene, and a structural unit (a2) having an acetal-type acid dissociable dissolution inhibiting group, and the acid-generator component (B) including an acid generator (B1-i) having at least one anion moiety selected from the group consisting of anion moieties represented by general formula (b-3), (b-4), and (b-5), an acid generator (B1-ii) having an anion moiety represented by general formula (b-6) shown below, or an acid generator (B1-iii) having a cation moiety represented by general formula (b'-3) shown below:

[Chemical Formula 1]

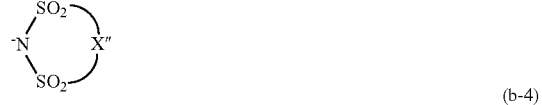

wherein X" represents an alkylene group of 2 to 6 carbon atoms in which at least one hydrogen atom has been substituted with a fluorine atom; Y" and Z", U", V", and W" each independently represents an alkyl group of 1 to 10 carbon atoms in which at least one hydrogen atom has been substituted with a fluorine atom,

[Chemical Formula 2]

$$R^{10"}\text{—SO}_3^-  \qquad (b\text{-}6)$$

wherein $R^{10"}$ represents a hydrocarbon group which may or may not have a substituent,

[Chemical Formula 3]

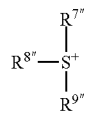

wherein $R^{7"}$ to $R^{9"}$ each independently represents a phenyl group or naphthyl group that may or may not have a substituent; with the proviso that the case where all of $R^{7"}$ to $R^{9"}$ represent phenyl groups which do not have a substituent is excluded.

6 Claims, No Drawings

POSITIVE RESIST COMPOSITION AND METHOD OF FORMING RESIST PATTERN

RELATED APPLICATIONS

This application is the U.S. National Phase filing under 35 U.S.C. §371 of PCT/JP2007/061648, filed Jun. 8, 2007, which designated the United States and was published in a language other than English, which claims priority under 35 U.S.C. §119(a)-(d) to Japanese Patent Application No. 2006-201008, filed Jul. 24, 2006; Japanese Patent Application No. 2006-203629, filed Jul. 26, 2006; and Japanese Patent Application No. 2006-203630, filed Jul. 26, 2006. The contents of these applications are incorporated herein by reference in their entireties.

TECHNICAL FIELD

The present invention relates to a positive resist composition and a method of forming a resist pattern.

Priority is claimed on Japanese Patent Application No. 2006-201008, filed Jul. 24, 2006, Japanese Patent Application No. 2006-203629, filed Jul. 26, 2006, and Japanese Patent Application No. 2006-203630, filed Jul. 26, 2006, the contents of which are incorporated herein by reference.

BACKGROUND ART

In photolithography techniques, for example, a resist film composed of a resist composition is formed on a substrate, and the resist film is subjected to selective exposure of radial rays such as light or electron beam through a photomask having a predetermined pattern, followed by development, thereby forming a resist pattern having a predetermined shape on the resist film. A resist composition in which the exposed portions become soluble in a developing solution is called a positive-type, and a resist composition in which the exposed portions become insoluble in a developing solution is called a negative-type.

In recent years, in the production of semiconductor elements and liquid crystal display elements, advances in lithography techniques have lead to rapid progress in the field of pattern miniaturization. Typically, these miniaturization techniques involve shortening the wavelength of the exposure light. Conventionally, ultraviolet radiation typified by g-line and i-line radiation has been used, but nowadays KrF excimer lasers (248 nm) have been introduced, and ArF excimer lasers (193 nm) are now also starting to be introduced. Furthermore, research is also being conducted into lithography techniques that use exposure light source having a wavelength shorter than these excimer lasers, such as $F_2$ excimer lasers (157 nm), extreme ultraviolet radiation (EUV), electron beam, and X ray.

Reproduction of patterns with very fine dimensions requires resist materials with high resolution. As such resist materials, chemically amplified resist compositions are used, which include a base resin and an acid generator that generates acid upon exposure. For example, a chemically amplified positive resist contains a resin component in which the alkali solubility increases by the action of an acid and an acid generator component that generates acid upon exposure, and when an acid is generated from the acid generator by exposure in the formation of a resist pattern, the exposed portions become alkali soluble.

Typically, resins such as polyhydroxystyrene (PHS) based resins in which the hydroxyl groups have been protected with acid dissociable, dissolution inhibiting groups or resins having structural units derived from (meth)acrylic acid within the main chain (namely, an acrylic-based resin) in which the carboxyl groups have been protected with acid dissociable, dissolution inhibiting groups are used as resin components of chemically amplified positive resist compositions. Examples of acid dissociable dissolution inhibiting groups used include: the so-called acetal groups such as chain-like ether groups typified by a 1-ethoxyethyl group, and cyclic ether groups typified by a tetrahydropyranyl group; tertiary alkyl groups typified by a tert-butyl group; and tertiary alkoxycarbonyl groups typified by a tert-butoxycarbonyl group (for example, see Patent Document 1).

Here, the term "(meth)acrylic acid" is a generic term that includes either or both of acrylic acid having a hydrogen atom bonded to the α-position and methacrylic acid having a methyl group bonded to the α-position. The term "(meth) acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

On the other hand, as acid generators of chemically amplified positive resist compositions, a multitude of acid generators have already been proposed. Examples thereof include onium salt-based acid generators such as iodonium salts and sulfonium salts; oxime sulfonate-based acid generators; diazomethane-based acid generators; nitrobenzylsulfonate-based acid generators; iminosulfonate-based acid generators; and disulfone-based acid generators. Currently, onium salt-based acid generators are generally used as acid generators. Of these, the onium salt-based acid generators which include a cation moiety composed of triphenylsulfonium (TPS) and an anion moiety composed of fluorinated alkylsulfonic acid ions such as nonafluorobutanesulfonate are the most widely used, since they exhibit a powerful acid-generating capability (for example, refer to Patent Document 2).

[Patent Document 1] Japanese Unexamined Patent Application, First Publication No. 2002-341538

[Patent Document 2] Japanese Unexamined Patent Application, First Publication No. 2003-241385

DISCLOSURE OF INVENTION

Problems to be Solved by the Invention

The miniaturization of resist patterns has continued to progress in recent years, and further improvements in resolution have been required with the resist patterns formed by the conventional chemically amplified positive resist compositions.

Further, the formation of resist patterns having an excellent shape is becoming highly important as the resist pattern dimensions are reduced as described above, since the lithography processes using electron beams or EUV or the like are targeting the formation of very fine patterns with dimensions of several tens of nanometers.

However, the resist patterns formed by the conventional chemically amplified positive resist compositions tend to suffer from thickness loss and the resulting resist pattern shapes were unsatisfactory, with problems including rounding of the top portions of the resist pattern.

Here, the term "thickness loss" refers to the difference in the resist film thickness before and after the developing process, and the resist film becomes more useful for the process, in which etching is conducted using the resist pattern as a mask, as the difference in the resist film thickness becomes minimal, in other words, as the level of thickness loss reduces.

The present invention takes the above circumstances into consideration, with an object of providing a positive resist composition which is capable of forming a resist pattern having excellent resolution and an excellent shape, and a method of forming a resist pattern.

Means for Solving the Problems

As a result of diligent studies, present inventors have found that the aforementioned problems can be solved by using a resin component containing two specific structural units serving as a base resin and an acid generator having a specific anion moiety or cation moiety. The present invention has been completed, based on this finding.

Specifically, a first aspect of the present invention is a positive resist composition including a resin component (A) which exhibits increased alkali solubility under action of acid and an acid-generator component (B) which generates acid upon exposure, the resin component (A) including a structural unit (a1) derived from hydroxystyrene, and a structural unit (a2) represented by general formula (a2-1) or (a2-2) shown below, and the acid-generator component (B) including an acid generator (B1-i) having at least one anion moiety selected from the group consisting of anion moieties represented by general formulas (b-3), (b-4), and (b-5) shown below, an acid generator (B1-ii) having an anion moiety represented by general formula (b-6) shown below, or an acid generator (B1-iii) having a cation moiety represented by general formula (b'-3) shown below.

[Chemical Formula 1]

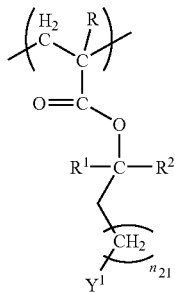
(a2-1)

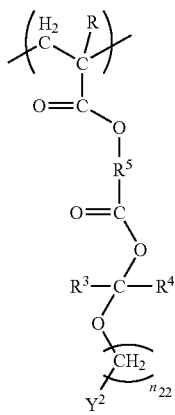
(a2-2)

[In general formula (a2-1), R represents a hydrogen atom, a halogen atom, a lower alkyl group or a halogenated lower alkyl group; $R^1$ and $R^2$ each independently represents a hydrogen atom or a lower alkyl group; $Y^1$ represents a lower alkyl group or a monovalent aliphatic cyclic group; and $n_{21}$ represents an integer of 0 to 3; and in general formula (a2-2), R is as defined above; $R^3$ and $R^4$ each independently represents a hydrogen atom or a lower alkyl group; $R^5$ represents an alkylene group or a divalent aliphatic cyclic group; $Y^2$ represents a lower alkyl group or a monovalent aliphatic cyclic group; and $n_{22}$ represents an integer of 0 to 3.]

[Chemical Formula 2]

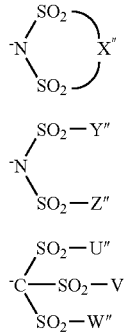

(b-3)

(b-4)

(b-5)

[In formula (b-3), X" represents an alkylene group of 2 to 6 carbon atoms in which at least one hydrogen atom has been substituted with a fluorine atom; in formula (b-4), Y" and Z" each independently represents an alkyl group of 1 to 10 carbon atoms in which at least one hydrogen atom has been substituted with a fluorine atom; and in formula (b-5), U", V", and W" each independently represents an alkyl group of 1 to 10 carbon atoms in which at least one hydrogen atom has been substituted with a fluorine atom.]

[Chemical Formula 3]

$R^{10"}$—$SO_3^-$ (b-6)

[In formula (b-6), $R^{10"}$ represents a hydrocarbon group which may or may not have a substituent].

[Chemical Formula 4]

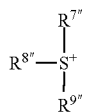

(b'-3)

[In formula (b'-3), $R^{7"}$ to $R^{9"}$ each independently represents a phenyl group or naphthyl group that may or may not have a substituent; with the proviso that the case where all of $R^{7"}$ to $R^{9"}$ represent phenyl groups which do not have a substituent is excluded.]

A second aspect of the present invention is a method of forming a resist pattern, including: applying a positive resist composition of the first aspect to a substrate to form a resist film on the substrate; subjecting the resist film to exposure; and developing the resist film to form a resist pattern.

In the present description and claims, the term "structural unit" refers to a monomer unit that contributes to the formation of a resin (polymer).

An "alkyl group" includes linear, branched or cyclic, monovalent saturated hydrocarbon, unless otherwise specified.

An "alkylene group" includes linear, branched or cyclic, divalent saturated hydrocarbon, unless otherwise specified.

A "lower alkyl group" is an alkyl group of 1 to 5 carbon atoms.

The term "exposure" is used as a general concept that includes irradiation with any form of radiation.

Effects of the Invention

According to the present invention, there are provided a positive resist composition which is capable of forming a resist pattern having excellent resolution and an excellent shape, and a method of forming a resist pattern.

Best Mode for Carrying Out the Invention

<<Positive Resist Composition>>

The positive resist composition of the present invention includes a resin component (A) (hereafter, frequently referred to as "component (A)") which exhibits increased alkali solubility under action of acid and an acid-generator component (B) (hereafter, frequently referred to as "component (B)") which generates acid upon exposure.

The positive resist composition is alkali insoluble prior to exposure, and when acid is generated from the component (B) upon exposure, the generated acid acts on the component (A) to increase the alkali solubility thereof.

Therefore, in the formation of a resist pattern, by conducting selective exposure of a resist film formed by applying the positive resist composition onto a substrate, the exposed portions become alkali soluble, whereas the unexposed portions remain alkali insoluble, and hence, a resist pattern can be formed by alkali developing.

<Component (A)>

In the present invention, the component (A) includes a structural unit (a1) derived from hydroxystyrene, and a structural unit (a2) represented by general formula (a2-1) or (a2-2) shown above.

[Structural Unit (a1)]

The structural unit (a1) is a structural unit derived from hydroxystyrene. By virtue of the component (A) including the structural unit (a1) and the structural unit (a2) described below, the effects of the present invention are improved. Moreover, the inclusion of the structural unit (a1) in the component (A) improves dry etching resistance. Furthermore, there is also an advantage that hydroxystyrene serving as a raw material of the structural unit (a1) is easily available at a low cost.

Here the term "hydroxystyrene" refers to a general concept including: hydroxystyrene itself; structures in which the hydrogen atom at the α-position in hydroxystyrene has been substituted by a substituent group or atom such as a halogen atom, an alkyl group, or a halogenated alkyl group; and derivatives thereof.

The term "structural unit derived from hydroxystyrene" refers to a structural unit which is formed by the cleavage of the ethylenic double bond of hydroxystyrene.

Preferable examples of the structural unit (a1) include structural units represented by general formula (a-1) shown below.

[Chemical Formula 5]

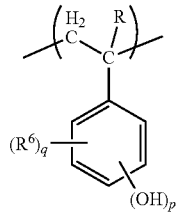

(a-1)

[In formula (a-1), R represents a hydrogen atom, a halogen atom, a lower alkyl group or a halogenated lower alkyl group; $R^6$ represents a lower alkyl group; p represents an integer of 1 to 3; and q represents an integer of 0 to 2.]

Examples of the halogen atom for R in general formula (a-1) include a fluorine atom, a chlorine atom, a bromine atom and an iodine atom, and a fluorine atom is particularly desirable.

The lower alkyl group for R is an alkyl group of 1 to 5 carbon atoms and specific examples thereof include linear or branched alkyl groups such as a methyl group, an ethyl group, a propyl group, an isopropyl group, an n-butyl group, an isobutyl group, a tert-butyl group, a pentyl group, an isopentyl group, and a neopentyl group. Of these, a methyl group is preferable.

The halogenated lower alkyl group for R is a group in which a part or all of the hydrogen atoms of the aforementioned alkyl group is substituted with the aforementioned halogen atoms, and is preferably a fluorinated lower alkyl group, and most preferably a lower alkyl group in which all hydrogen atoms of the alkyl group have been substituted with fluorine atoms. Specific examples of the fluorinated lower alkyl group include a trifluoromethyl group, a hexafluoroethyl group, a heptafluoropropyl group, and a nonafluorobutyl group.

As R, a hydrogen atom or a lower alkyl group is preferable, and a hydrogen atom or a methyl group is particularly desirable.

p represents an integer of 1 to 3, and preferably 1.

The bonding position of the hydroxyl group may be any one of the o-position, the m-position, or the p-position of the phenyl group. When p is 1, the p-position is preferable in terms of availability and low cost. When p is 2 or 3, any combination of the substitution positions is suitable.

q represents an integer of 0 to 2, preferably 0 or 1, and most preferably 0 from an industrial point of view.

As the lower alkyl group for $R^6$, the same as the lower alkyl group for R can be used.

When q is 1, the substitution position of $R^6$ may be any one of the o-position, the m-position, or the p-position, and when q is 2, any combination of the substitution positions is suitable.

As the structural unit (a1), one type of structural unit may be used alone, or two or more types of structural units may be used in combination.

The amount of the structural unit (a1) within the component (A) based on the combined total of all structural units constituting the component (A) is preferably 50 to 90 mol %, more preferably 55 to 85 mol %, and still more preferably 60 to 80 mol %. By making the amount of the structural unit (a1) within the above range, a suitable level of alkali solubility as well as a good balance with the other structural units can be achieved.

[Structural Unit (a2)]

The structural unit (a2) is a structural unit represented by general formula (a2-1) or (a2-2) above. By virtue of the component (A) including the structural unit (a1) and the structural unit (a2) described below, the effects of the present invention are improved.

Hereafter, the structural unit represented by general formula (a2-1) will be referred to as the "structural unit (a2-1)", and the structural unit represented by general formula (a2-2) will be hereafter referred to as the "structural unit (a2-2)".

The group represented by formula —C($R^1$)($R^2$)—O—($CH_2$)$n_{21}$—$Y^1$ in general formula (a2-1) and the group represented by formula —C($R^3$)($R^4$)—O—($CH_2$)$n_{22}$—$Y^2$ in general formula (a2-2) are the so-called acetal-type acid dissociable, dissolution inhibiting groups.

The structural units (a2-1) and (a2-2) have a common structure in which the acetal-type acid dissociable, dissolution inhibiting group is bonded to the oxygen atom at the terminal of the carbonyloxy group (—C(O)—O—). In such a structure, when acid is generated from the component (B) upon exposure, the action of the acid causes cleavage of the bond between the acid dissociable, dissolution inhibiting group and the oxygen atom at the terminal of the carbonyloxy group.

In the present description and claims, the expression "acid dissociable" used in the term "acid dissociable, dissolution inhibiting group" means that the group is dissociable from the component (A) by the action of acid generated from the component (B) upon exposure.

On the other hand, the expression "dissolution inhibiting group" used in the term "acid dissociable, dissolution inhibiting group" refers to a group having an alkali dissolution-inhibiting effect that renders the entire component (A) alkali insoluble prior to dissociation, and then following dissociation, renders the entire component (A) alkali soluble.

Therefore, the component (A) that includes the structural unit (a2) is alkali insoluble prior to exposure, and when acid is generated from the component (B) upon exposure, the acid dissociable, dissolution inhibiting group is dissociated by the generated acid, thereby increasing the alkali solubility of the entire component (A) to render it alkali soluble. Therefore, in the formation of a resist pattern, by conducting selective exposure of a resist film formed by using the positive resist composition, the exposed portions become alkali soluble, whereas the unexposed portions remain alkali insoluble, and hence, a resist pattern can be formed by alkali developing.

In general formula (a2-1), R represents a hydrogen atom, a halogen atom, a lower alkyl group or a halogenated lower alkyl group. As R in general formula (a2-1), the same groups as those for R in general formula (a-1) above can be used.

$R^1$ and $R^2$ each independently represents a hydrogen atom or a lower alkyl group. The lower alkyl group for $R^1$ and $R^2$ is an alkyl group of 1 to 5 carbon atoms and specific examples thereof include linear or branched alkyl groups such as a methyl group, an ethyl group, a propyl group, an isopropyl group, an n-butyl group, an isobutyl group, a tert-butyl group, a pentyl group, an isopentyl group, and a neopentyl group. Of these, a methyl group or an ethyl group is preferable in view of industrial availability.

In terms of achieving superior effects for the present invention, at least one of $R^1$ and $R^2$ is preferably a hydrogen atom, and it is particularly desirable that both groups are hydrogen atoms.

$n_{21}$ represents an integer of 0 to 3, preferably 0 or 1, and most preferably 0.

$Y^1$ represents a lower alkyl group or a monovalent aliphatic cyclic group.

As the lower alkyl group for $Y^1$, the same lower alkyl groups as those for R above can be used.

As the aliphatic cyclic group for $Y^1$, any of the aliphatic monocyclic/polycyclic groups which have been proposed for the conventional resins of resists designed for use with ArF excimer lasers can be appropriately selected for use.

In the present description and claims, the term "aliphatic cyclic group" refers to a monocyclic group or polycyclic group that has no aromaticity.

The aliphatic cyclic groups for $Y^1$ may or may not have a substituent.

Examples of substituents include a lower alkyl group of 1 to 5 carbon atoms, a fluorine atom, a fluorinated lower alkyl group of 1 to 5 carbon atoms, and a hydrophilic group. Examples of the hydrophilic group include =O, —COOR' (wherein R' is an alkyl group), alcoholic hydroxyl groups, —OR' (wherein R' is an alkyl group), imino groups, and amino groups, although from the viewpoint of availability, an =O group or an alcoholic hydroxyl group is preferable.

The basic ring structure (the basic ring) of the aliphatic cyclic group excluding substituent groups may be either a ring formed solely from carbon and hydrogen (a hydrocarbon ring), or a heterocycle in which a portion of the carbon atoms that constitute a hydrocarbon ring are substituted with a hetero atom such as a sulfur atom, an oxygen atom, or a nitrogen atom. In terms of the effects achieved for the present invention, the basic ring within the group $Y^1$ is preferably a hydrocarbon ring.

This hydrocarbon ring can be appropriately selected from the multitude of compounds proposed for the resins of resists designed for use with ArF excimer lasers, KrF excimer lasers, and the like, and examples thereof include monocycloalkanes, and polycycloalkanes such as bicycloalkanes, tricycloalkanes, and tetracycloalkanes. Specific examples of monocycloalkanes include cyclopentane and cyclohexane. Specific examples of polycycloalkanes include adamantane, norbornane, norbornene, methylnorbornane, ethylnorbornane, methylnorbornene, ethylnorbornene, isobornane, tricyclodecane, and tetracyclododecane. Of these, cyclohexane, cyclopentane, adamantane, norbornane, norbornene, methylnorbornane, ethylnorbornane, methylnorbornene, ethylnorbornene, and tetracyclododecane are preferred industrially, and adamantane is particularly desirable.

Preferable examples of the group represented by formula —C($R^1$)($R^2$)—O—($CH_2$)$n_{21}$—$Y^1$ include the groups represented by formulas (4) to (15) shown below.

(4)

[Chemical Formula 6]

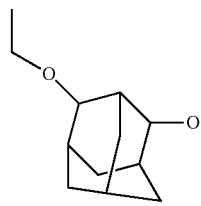

(5) 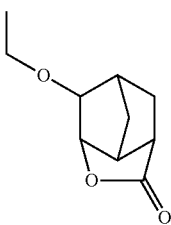

(6) 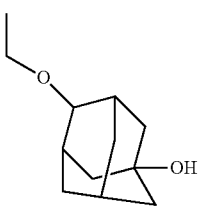

(7) 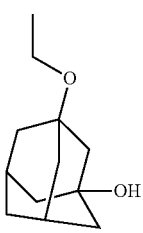

(8) 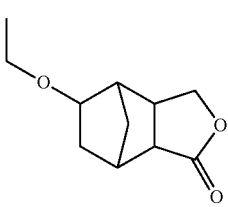

(9) 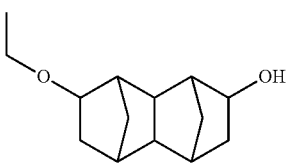

(10) 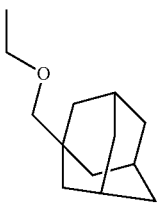

(11) 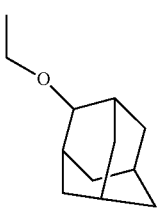

(12) 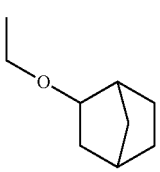

(13) 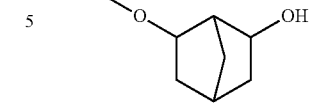

(14) 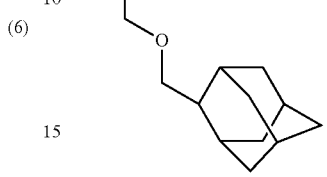

(15) 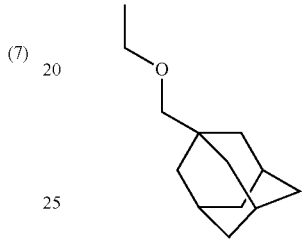

In general formula (a2-2), R is as defined for R in general formula (a-1) above; $R^3$ and $R^4$ each independently represents a hydrogen atom or a lower alkyl group; $Y^2$ represents a lower alkyl group or a monovalent aliphatic cyclic group; and $n_{22}$ represents an integer of 0 to 3.

As the above R, $R^3$, $R^4$, $n_{22}$, and $Y^2$, the same groups as those for R, $R^1$, $R^2$, $n_{21}$, and $Y^1$ in general formula (a2-1) above can be used, respectively.

$R^5$ represents an alkylene group or a divalent aliphatic cyclic group.

As the alkylene group for $R^5$, an alkylene group of 1 to 4 carbon atoms is preferable.

The aliphatic cyclic group for $R^5$ may or may not have a substituent. Examples of substituents include a lower alkyl group of 1 to 5 carbon atoms, a fluorine atom, a fluorinated lower alkyl group of 1 to 5 carbon atoms, and an oxygen atom (=O).

The basic ring of the aliphatic cyclic group for $R^5$ exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated. Furthermore, the aliphatic cyclic group for $R^5$ is preferably a polycyclic group.

As such aliphatic cyclic groups for $R^5$, groups in which two or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group, may be used. Specific examples include groups in which two or more hydrogen atoms have been removed from a monocycloalkane such as cyclopentane and cyclohexane; and groups in which two or more hydrogen atoms have been removed from a polycycloalkane such as adamantane, norbornane, isobornane, tricyclodecane or tetracyclododecane.

As the aliphatic cyclic group for $Y^2$, a group represented by general formula (y-1) shown below is particularly desirable.

[Chemical Formula 7]

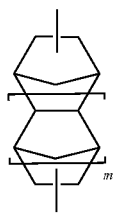
(y-1)

wherein m represents 0 or 1, and preferably 1.

Specific examples of the structural unit (a2-1) represented by general formula (a2-1) include structural units represented by general formulas (a1-2-1) to (a1-2-43) shown below.

Specific examples of the structural unit (a2-2) represented by general formula (a2-2) include structural units represented by general formulas (a1-4-1) to (a1-4-30) shown below.

[Chemical Formula 8]

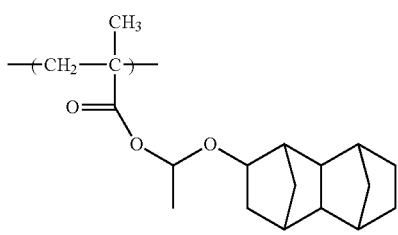
(a1-2-1)

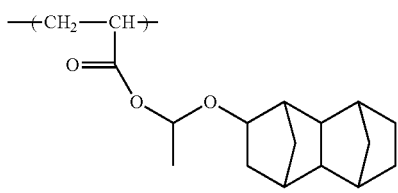
(a1-2-2)

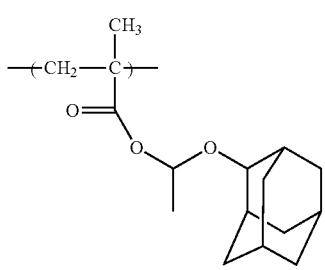
(a1-2-3)

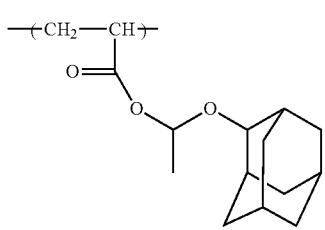
(a1-2-4)

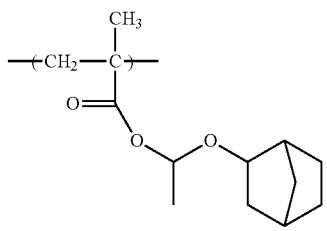
(a1-2-5)

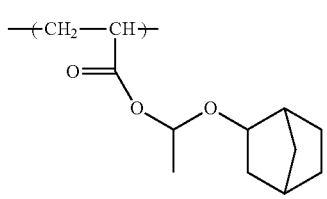
(a1-2-6)

[Chemical Formula 9]

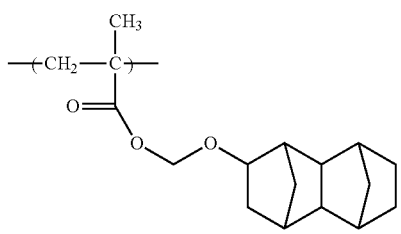
(a1-2-7)

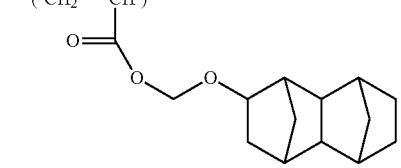
(a1-2-8)

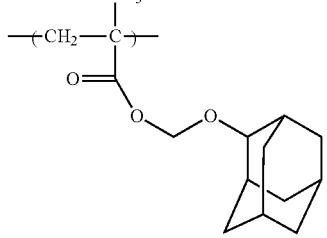
(a1-2-9)

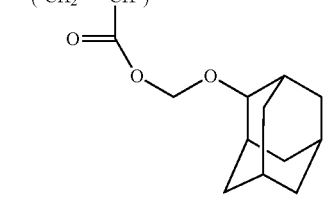
(a1-2-10)

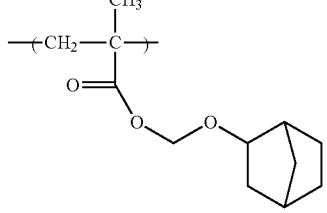
(a1-2-11)

(a1-2-12) 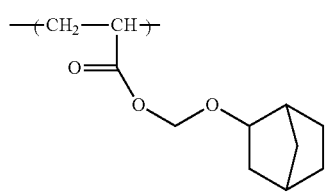
(a1-2-13) 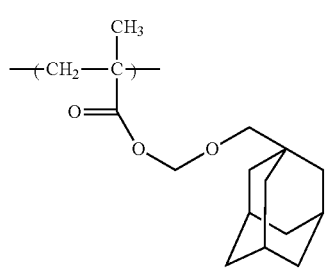
(a1-2-14) 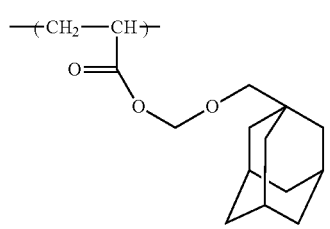
(a1-2-15) 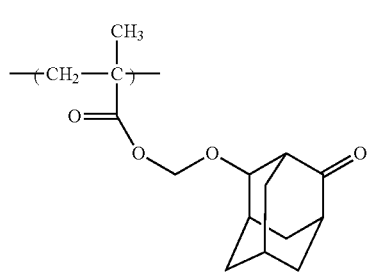
(a1-2-16) 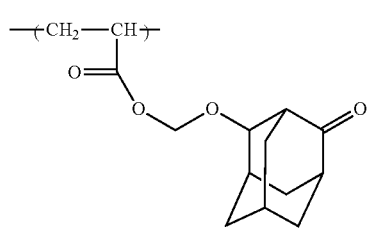
(a1-2-17) 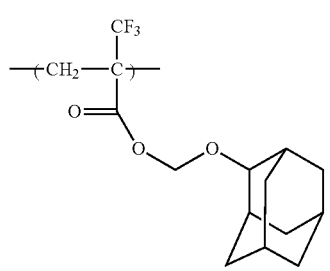
(a1-2-18) 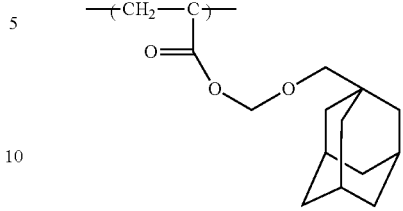
(a1-2-19) 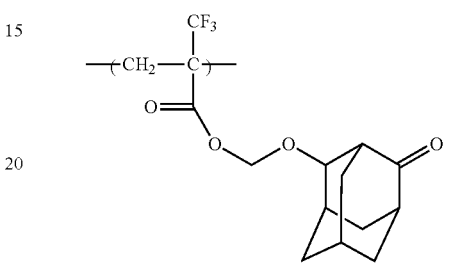
(a1-2-20) 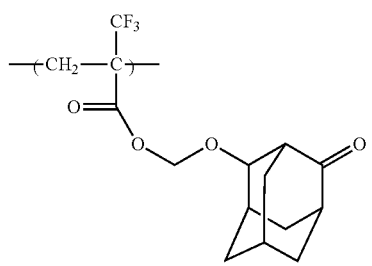
(a1-2-21) 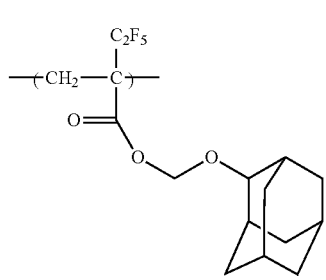
[Chemical Formula 10]
(a1-2-22) 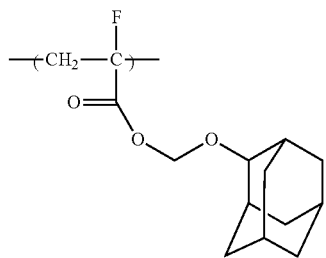
(a1-2-23) 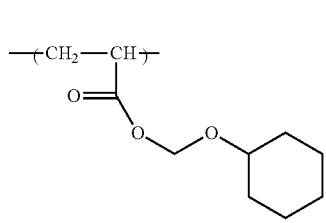

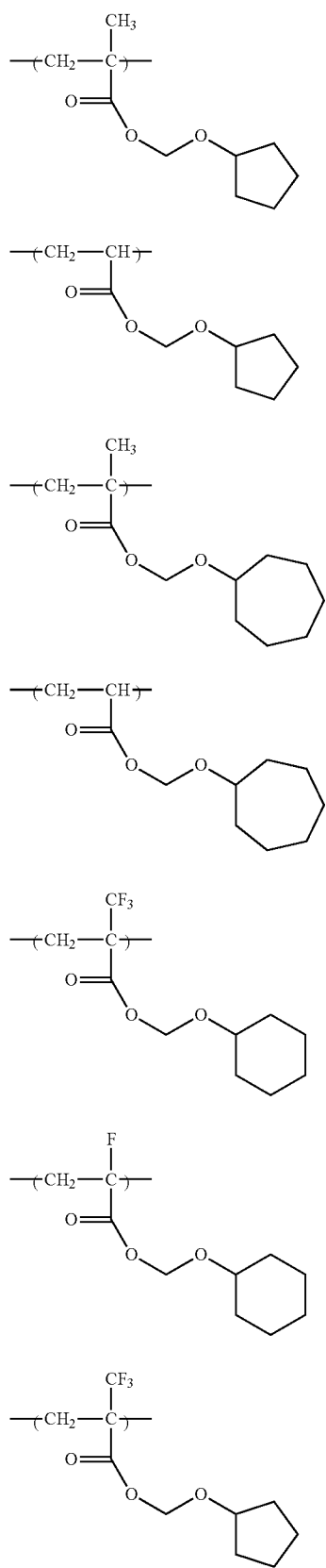
(a1-2-24)
(a1-2-25)
(a1-2-26)
(a1-2-27)
(a1-2-28)
(a1-2-29)
(a1-2-30)
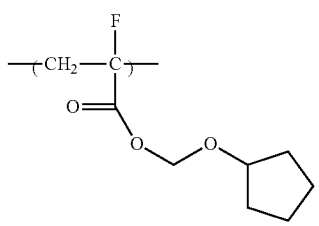
(a1-2-31)
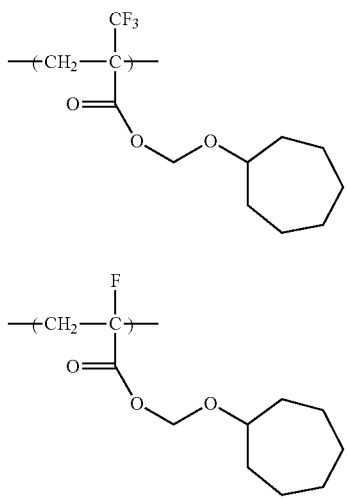
(a1-2-32)
(a1-2-33)
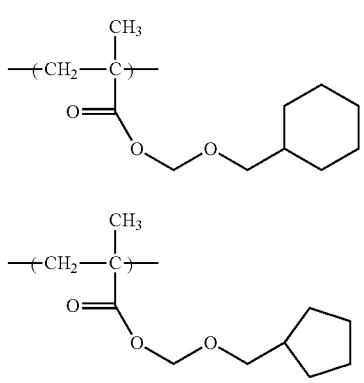
(a1-2-34)
(a1-2-35)
[Chemical Formula 11]
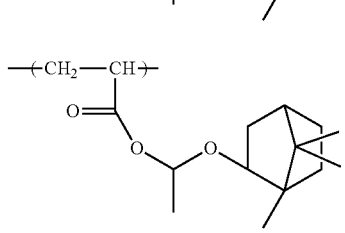
(a1-2-36)
(a1-2-37)

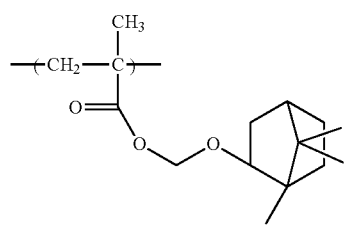 (a1-2-38)
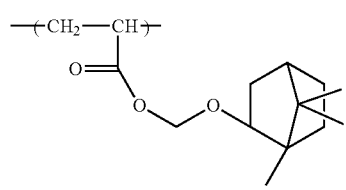 (a1-2-39)
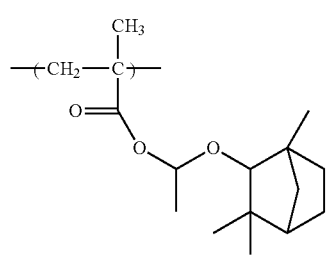 (a1-2-40)
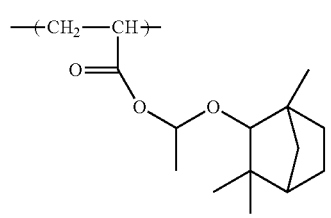 (a1-2-41)
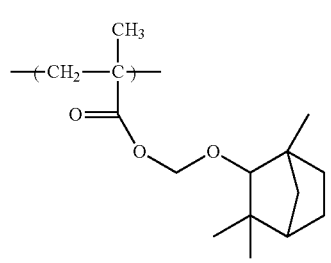 (a1-2-42)
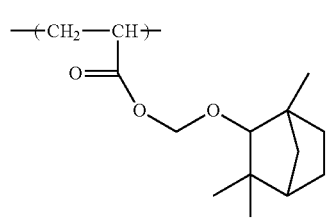 (a1-2-43)
[Chemical Formula 12]
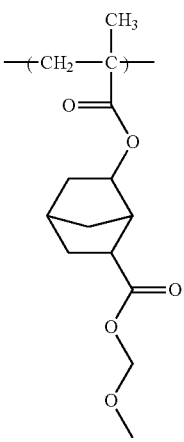 (a1-4-1)
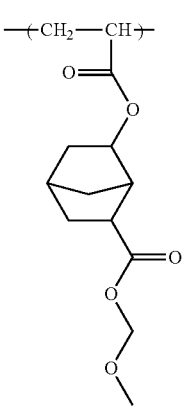 (a1-4-2)
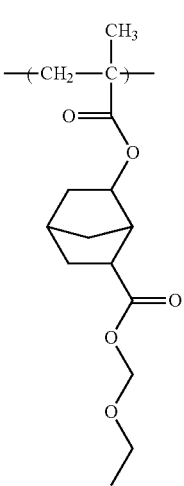 (a1-4-3)

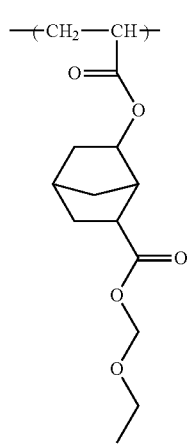
(a1-4-4)
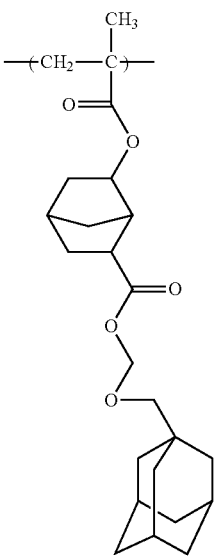
(a1-4-7)
(a1-4-5)
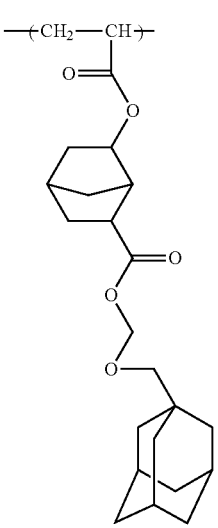
(a1-4-8)
(a1-4-6)
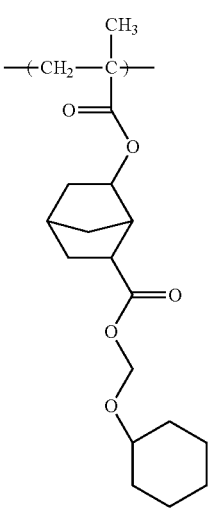
(a1-4-9)

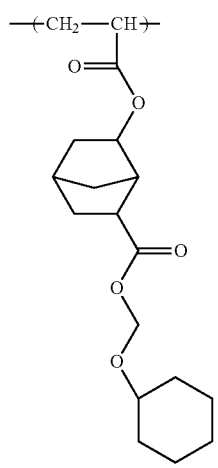 (a1-4-10)
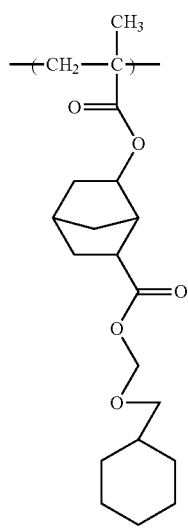 (a1-4-11)
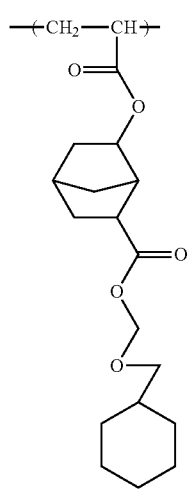 (a1-4-12)
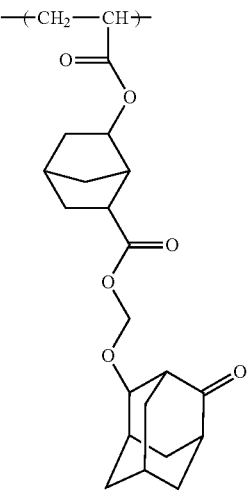 (a1-4-13)
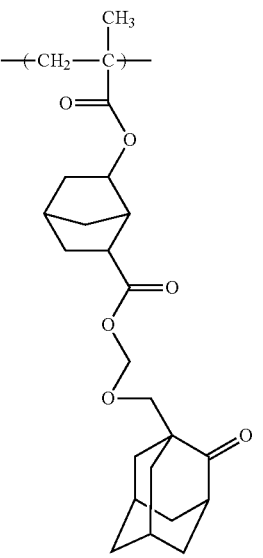 (a1-4-14)
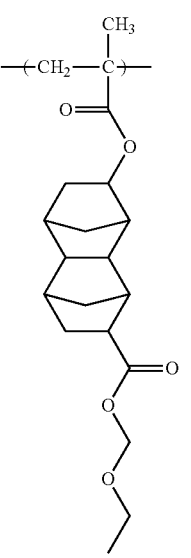 (a1-4-15)

[Chemical Formula 13]
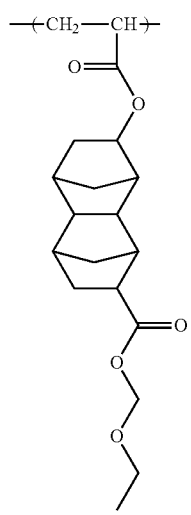
(a1-4-16)
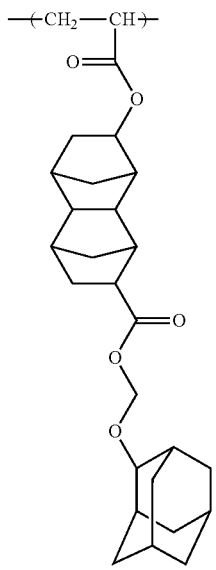
(a1-4-17)
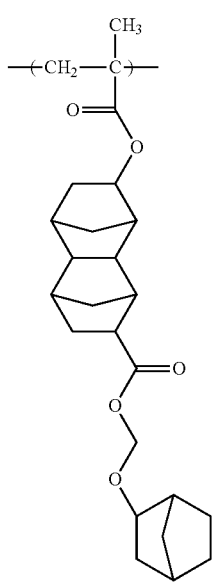
(a1-4-18)
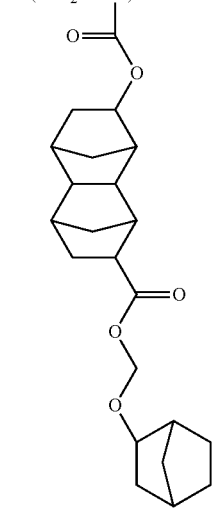
(a1-4-19)
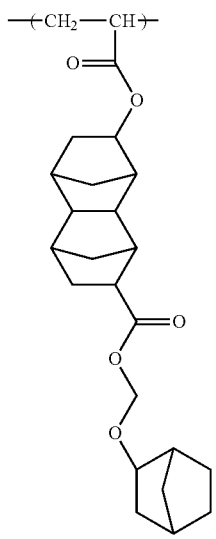
(a1-4-20)

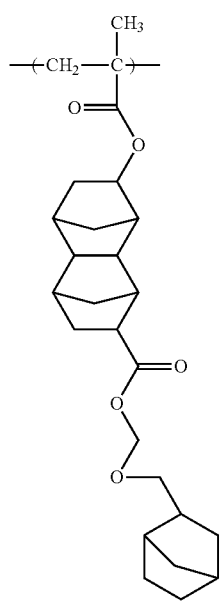 (a1-4-21)
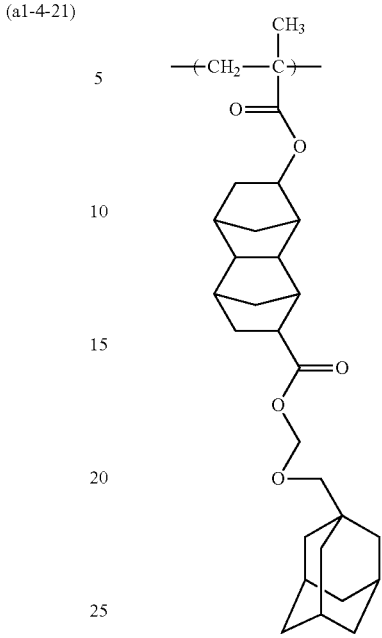 (a1-4-23)
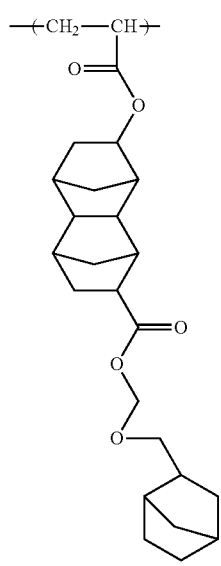 (a1-4-22)
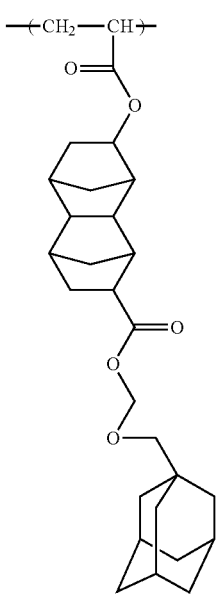 (a1-4-24)

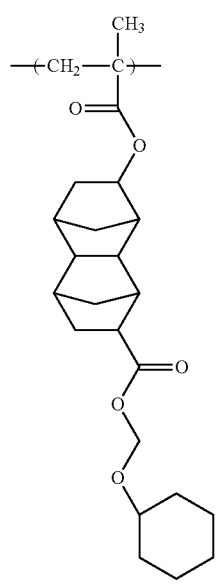
(a1-4-25)
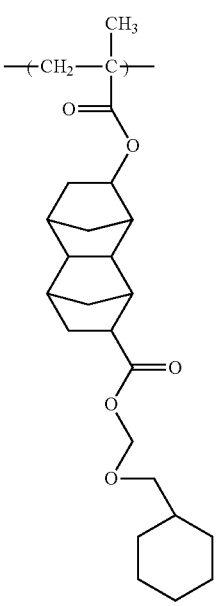
(a1-4-27)
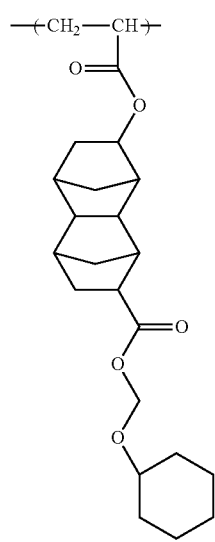
(a1-4-26)
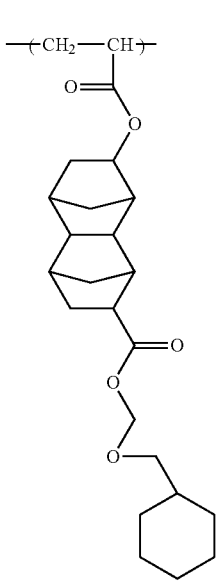
(a1-4-28)

-continued

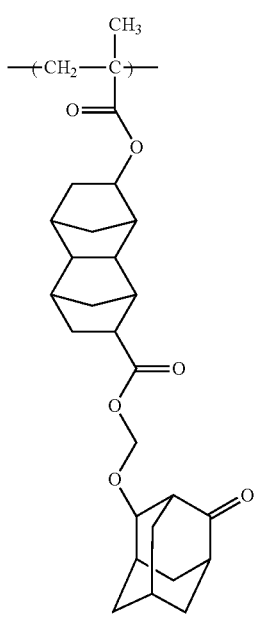

(a1-4-29)

(a1-4-30)

In terms of achieving superior effects for the present invention, it is more preferable that the structural unit (a2) be the structural unit (a2-1). Of these, in terms of achieving superior effects for the present invention, the structural units represented by formulas (a1-2-9), (a1-2-10), (a1-2-13), (a1-2-14), (a1-2-15), and (a1-2-16) above are particularly desirable.

As the structural unit (a2), one type of structural unit may be used alone, or two or more types may be used in combination.

In the component (A), the amount of the structural unit (a2) based on the combined total of all structural units constituting the component (A) is preferably 5 to 50 mol %, more preferably 10 to 40 mol %, and still more preferably 15 to 35 mol %. By making the amount of the structural unit (a2) at least as large as the lower limit of the above-mentioned range, a pattern can be easily formed using a positive resist composition prepared from the component (A). On the other hand, by making the amount of the structural unit (a2) no more than the upper limit of the above-mentioned range, a good balance can be achieved with the other structural units.

[Other Structural Units]

The component (A) may further include a structural unit (a4) derived from styrene, in addition to the structural units (a1) and (a2).

In the present invention, the structural unit (a4) is not essential. However, when this structural unit is included, solubility of the component (A) in a developing solution can be adjusted. In addition, the inclusion of the structural unit (a4) improves dry etching resistance.

Here, the term "styrene" refers to a general concept including styrene itself, and structures in which the hydrogen atom at the α-position in styrene has been substituted by a substituent group or atom such as a halogen atom, an alkyl group, or a halogenated alkyl group. The term "structural unit derived from styrene" refers to a structural unit which is formed by the cleavage of the ethylenic double bond of styrene. In the styrene, the hydrogen atom of the phenyl group may be substituted by a substituent such as an alkyl group of 1 to 5 carbon atoms.

Preferable examples of the structural unit (a4) include structural units represented by general formula (a4-1) shown below.

[Chemical Formula 14]

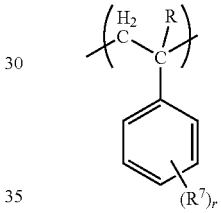

(a4-1)

wherein R is as defined for R in general formula (a-1) above; $R^7$ represents a lower alkyl group; and r represents an integer of 0 to 3.

In general formula (a4-1), R and $R^7$ are respectively as defined for R and $R^6$ in general formula (a-1) above.

r represents an integer of 0 to 3, preferably 0 or 1, and most preferably 0 from an industrial point of view.

When r is 1, the substitution position of $R^7$ may be any one of the o-position, the m-position, or the p-position of the phenyl group, and when r is 2 or 3, any combination of the substitution positions is suitable.

As the structural unit (a4), one type of structural unit may be used alone, or two or more types of structural units may be used in combination.

When the component (A) contains the structural unit (a4), the amount of the structural unit (a4) in the component (A) based on the combined total of all structural units constituting the component (A) is preferably 1 to 20 mol %, more preferably 3 to 15 mol %, and still more preferably 5 to 15 mol %. By making the amount of the structural unit (a4) at least as large as the lower limit of the above-mentioned range, the effects of including the structural unit (a4) are enhanced. On the other hand, by making the amount of the structural unit (a4) no more than the upper limit of the above-mentioned range, a good balance can be achieved with the other structural units.

The component (A) may also have a structural unit (a5) which is other than the above-mentioned structural units (a1), (a2), and (a4), as long as the effects of the present invention are not impaired.

As the structural unit (a5), any other structural unit which cannot be classified as one of the above structural units (a1), (a2), and (a4) can be used without any particular limitations, and any of the multitude of conventional structural units used within resist resins for ArF excimer lasers or KrF excimer lasers (and particularly for ArF excimer lasers) can be used.

In the present invention, the component (A) is a resin component that includes at least the structural unit (a1) and the structural unit (a2) above. As such a resin component, a copolymer having the structural units (a1) and (a2), a copolymer having the structural units (a1), (a2), and (a4), or the like can be used.

As the component (A), one type may be used alone, or two or more types may be used in combination.

The component (A) is preferably one containing a copolymer that includes two structural units shown in the following general formula (A-11).

[Chemical Formula 15]

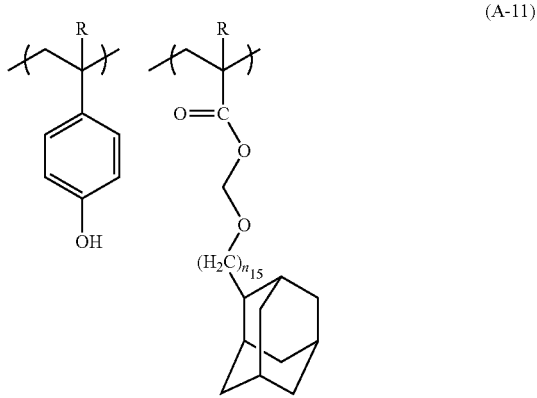

(A-11)

wherein R is as defined for R in general formula (a-1) above; and $n_{15}$ represents 0 or 1.

In general formula (A-11), R is preferably a hydrogen atom or a methyl group; and $n_{15}$ is most preferably 0.

The component (A) can be obtained, for example, by a conventional radical polymerization or the like of the monomers corresponding with each of the structural units, using a radical polymerization initiator such as azobisisobutyronitrile (AIBN).

Furthermore, in the component (A), by using a chain transfer agent such as HS—$CH_2$—$CH_2$—$CH_2$—$C(CF_3)_2$—OH, a —$C(CF_3)_2$—OH group can be introduced at the terminals of the component (A). Such a copolymer having introduced a hydroxyalkyl group in which a part of the hydrogen atoms of the alkyl group are substituted with fluorine atoms is effective in reducing LWR (line width roughness: a phenomenon in which the line width of a line pattern becomes heterogeneous). Such a copolymer is also effective in reducing developing defects and LER (line edge roughness: unevenness of the side walls of a line pattern).

The weight average molecular weight (Mw) (the polystyrene equivalent value determined by gel permeation chromatography (GPC)) of the component (A) is not particularly limited, but is preferably 2,000 to 50,000, more preferably 3,000 to 30,000, and most preferably 5,000 to 20,000. By making the weight average molecular weight no more than the upper limit of the above-mentioned range, the component (A) exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/Mn) is not particularly limited, but is preferably 1.0 to 5.0, more preferably 1.0 to 3.0, and most preferably 1.2 to 2.5. Here, Mn is the number average molecular weight.

<Component (B)>

In the present invention, the component (B) includes an acid generator (B1-i) having at least one anion moiety selected from the group consisting of anion moieties represented by general formulas (b-3), (b-4), and (b-5) above (hereafter referred to as "component (B1-i)"), an acid generator (B1-ii) having an anion moiety represented by general formula (b-6) above (hereafter referred to as "component (B1-ii)"), or an acid generator (B1-iii) having a cation moiety represented by general formula (b'-3) above (hereafter referred to as "component (B1-iii)").

By containing the component (B1-i), the component (B1-ii), or the component (B1-iii), resolution of the formed resist patterns can be improved and the resist patterns having an excellent shape can be easily obtained.

[Component (B1-i)]

As described above, the component (B1-i) is an acid generator having at least one anion moiety selected from the group consisting of anion moieties represented by general formulas (b-3), (b-4), and (b-5) above.

In general formula (b-3) above, X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

In general formula (b-4) above, Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

In general formula (b-5) above, U", V", and W" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group for X" or those of the alkyl group for Y", Z", U", V", and W" within the above-mentioned range of the number of carbon atoms, the more preferable since the solubility in a resist solvent is improved.

Further, in the alkylene group for X" or the alkyl group for Y", Z", U", V", and W", it is preferable that the number of hydrogen atoms substituted with fluorine atoms is as large as possible because the acid strength increases and the transparency to high energy radiation of 200 nm or less or electron beam is improved. The percentage of the fluorine atoms within the alkylene group or alkyl group, i.e., the fluorination ratio is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

As the cation moiety of the component (B1-i), there is no particular limitation, and the same cation moieties as those of acid generators which have conventionally been proposed, such as a cation moiety of an onium salt-based acid generator, can be used. As such cation moieties, the same cation moieties as those in the acid generator (B2) described later can be preferably used, and a cation moiety represented by general formula (b'-1) or (b'-2) shown below is particularly desirable.

[Chemical Formula 16]

[In formula (b'-1), $R^{1''}$ to $R^{3''}$ each independently represents an aryl group or an alkyl group, with the proviso that at least one of $R^{1''}$ to $R^{3''}$ represents an aryl group; and in formula (b'-2), $R^{5''}$ and $R^{6''}$ each independently represents an aryl group or an alkyl group, with the proviso that at least one of $R^{5''}$ and $R^{6''}$ represents an aryl group].

In formula (b'-1), $R^{1''}$ to $R^{3''}$ each independently represents an aryl group or an alkyl group. Further, among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ are aryl groups.

The aryl group for $R^{1''}$ to $R^{3''}$ is not particularly limited. For example, an aryl group having 6 to 20 carbon atoms may be used in which a part or all of the hydrogen atoms of the aryl group may or may not be substituted with alkyl groups, alkoxy groups, or halogen atoms. The aryl group is preferably an aryl group having 6 to 10 carbon atoms because it can be synthesized at a low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group for $R^{1''}$ to $R^{3''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is particularly desirable that each of $R^{1''}$ to $R^{3''}$ is a phenyl group or a naphthyl group.

In formula (b'-2), $R^{5''}$ and $R^{6''}$ each independently represents an aryl group or alkyl group. At least one of $R^{5''}$ and $R^{6''}$ represents an aryl group. It is preferable that both of $R^{5''}$ and $R^{6''}$ represent an aryl group.

As the aryl group for $R^{5''}$ and $R^{6''}$, the same aryl groups as those for $R^{1''}$ to $R^{3''}$ can be used.

As the alkyl group for $R^{5''}$ and $R^{6''}$, the same alkyl groups as those for $R^{1''}$ to $R^{3''}$ can be used.

It is particularly desirable that both of $R^{5''}$ and $R^{6''}$ represents a phenyl group.

Specific examples of cation moiety represented by general formula (b'-1) or (b'-2) include a diphenyliodonium ion, bis (4-tert-butylphenyl)iodonium ion, triphenylsulfonium ion, tri (4-methylphenyl)sulfonium ion, dimethyl(4-hydroxynaphthyl)sulfonium ion, monophenyldimethylsulfonium ion, diphenylmonomethylsulfonium ion, (4-methylphenyl)diphenylsulfonium ion, (4-methoxyphenyl)diphenylsulfonium ion, tri(4-tert-butyl)phenylsulfonium ion, diphenyl(1-(4-methoxy)naphthyl)sulfonium ion, diphenylmononaphthylsulfonium ion, and di(1-naphthyl)monophenylsulfonium ion.

Specific examples of the component (B1-i) are shown below.

[Chemical Formula 17]

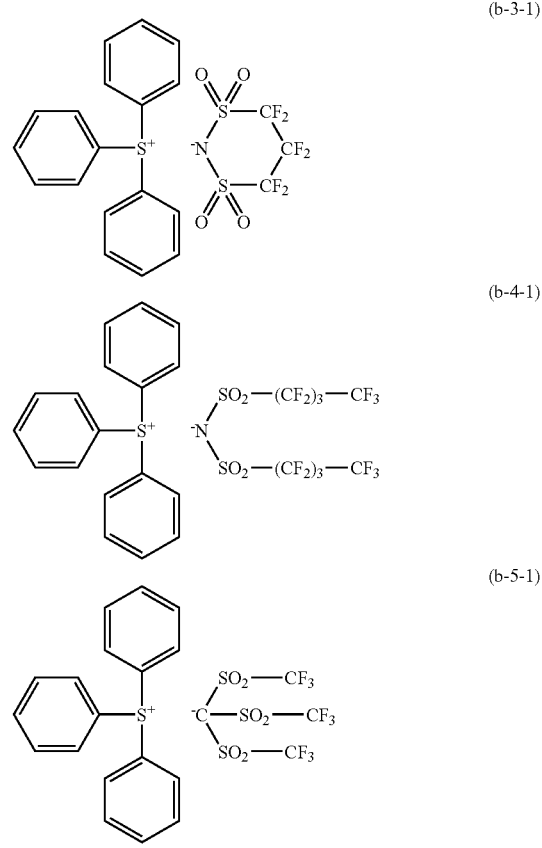

In the present invention, it is particularly desirable that the component (B1-i) be at least one acid generator selected from the group consisting of acid generators represented by chemical formulas (b-3-1), (b-4-1), and (b-5-1) above.

As the component (B1-i), one type of acid generator may be used alone, or two or more types may be used in combination.

In the positive resist composition of the present invention, when the component (B) contains the component (B1-i), the amount of the component (B1-i) based on the entire component (B) is preferably 40% by weight or more, more preferably 70% by weight or more, particularly preferably 80% by weight or more, and may be even 100% by weight. It is particularly desirable that the content of the component (B1- i) be 100% by weight. By making the amount of the component (B1-i) at least as large as the lower limit of the above-mentioned range, the resolution of the resist pattern is improved.

Further, in the positive resist composition of the present invention, when the component (B) contains the component (B1-i), the amount of the component (B1-i) is preferably 1 to 40 parts by weight, more preferably 5 to 25 parts by weight, and most preferably 10 to 20 parts by weight, relative to 100 parts by weight of the component (A). By making the amount of the component (B1-i) at least as large as the lower limit of the above-mentioned range, the resolution of the resist pattern is improved. On the other hand, by making the amount of the component (B1-i) no more than the upper limit of the above-mentioned range, the storage stability becomes more satisfactory.

[Component (B1-ii)]

As described above, the component (B1-ii) is an acid generator having an anion moiety represented by general formula (b-6) above.

In general formula (b-6) above, $R^{10'''}$ represents a hydrocarbon group which may or may not have a substituent.

Examples of substituents for $R^{10'''}$ include a lower alkyl group of 1 to 5 carbon atoms, and an oxygen atom (=O).

The hydrocarbon group for $R^{10'''}$ may be either an aliphatic hydrocarbon group or an aromatic hydrocarbon group.

The aliphatic hydrocarbon group for $R^{10'''}$ may be either saturated or unsaturated, but is preferably saturated.

Further, the aliphatic hydrocarbon group for $R^{10'''}$ may be either chain-like (linear or branched) or cyclic hydrocarbon group.

The chain-like hydrocarbon group is preferably a linear or branched alkyl group, and the alkyl group preferably has 1 to 10 carbon atoms, more preferably 1 to 8 carbon atoms, and still more preferably 3 to 8 carbon atoms.

Specific examples of linear or branched alkyl groups include a methyl group, an ethyl group, an n-propyl group, an isopropyl group, an n-butyl group, an isobutyl group, a tert-butyl group, a pentyl group, an isopentyl group, a neopentyl group, an n-hexyl group, an n-heptyl group, and an n-octyl group. Of these, a methyl group, an n-propyl group, an n-butyl group, and an n-octyl group are preferable, and an n-octyl group is particularly desirable.

With respect to the anion moiety represented by general formula (b-6) above, when $R^{10'''}$ is a linear or branched alkyl group, suitable examples of anion moieties (sulfonic acid ions) include those represented by general formula (b-6') shown below.

[Chemical Formula 18]

$$C_aH_{2a+1}-SO_3^- \quad (b\text{-}6')$$

[wherein a represents an integer of 1 to 10].

In general formula (b-6') above, a represents an integer of 1 to 10, and is preferably an integer of 1 to 8.

Specific examples of the anion moieties (sulfonic acid ions) represented by general formula (b-6') include a methanesulfonate ion, ethanesulfonate ion, n-propanesulfonate ion, n-butanesulfonate ion, and n-octanesulfonate ion.

With respect to the aliphatic hydrocarbon group for $R^{10'''}$, examples of cyclic hydrocarbon groups include an aliphatic cyclic group and a group in which at least one hydrogen atom of the chain-like hydrocarbon group has been substituted with an aliphatic cyclic group (an aliphatic-cyclic-group containing group).

The aliphatic cyclic group preferably has 3 to 12 carbon atoms, and more preferably 4 to 10 carbon atoms.

Further, the aliphatic cyclic group may be either a polycyclic group or a monocyclic group. As the monocyclic group, groups in which one hydrogen atom has been removed from a monocycloalkane of 3 to 6 carbon atoms are preferable, and examples thereof include a cyclopentyl group and cyclohexyl group. The polycyclic group preferably has 7 to 12 carbon atoms, and specific examples thereof include an adamantyl group, norbornyl group, isobornyl group, tricyclodecanyl group, and tetracyclododecanyl group. Of these, polycyclic groups are preferable, and an adamantyl group, norbornyl group, and tetracyclododecanyl group are particularly desirable from an industrial point of view. Further, as described above, these aliphatic cyclic groups may or may not have a substituent.

As the aliphatic cyclic group within the aliphatic-cyclic-group containing group, the same aliphatic cyclic groups as those described above can be used.

The chain-like hydrocarbon group to which the aliphatic cyclic group is bonded is preferably a linear or branched alkyl group, more preferably a lower alkyl group of 1 to 5 carbon atoms, and examples thereof include a methyl group, ethyl group, propyl group, isopropyl group, n-butyl group, isobutyl group, tert-butyl group, pentyl group, isopentyl group, and neopentyl group. Of these, linear alkyl groups are preferable, and from an industrial viewpoint, a methyl group or ethyl group is particularly desirable.

With respect to the anion moiety represented by general formula (b-6) above, when $R^{10'''}$ is a cyclic hydrocarbon group, suitable examples of anion moieties (sulfonic acid ions) include those represented by chemical formulas (b-6-1) to (b-6-7) shown below.

[Chemical Formula 19]

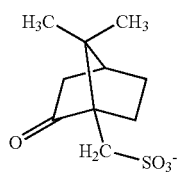

(b-6-1)

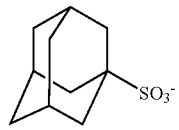

(b-6-2)

(b-6-3)

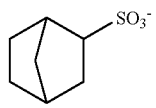

(b-6-4)

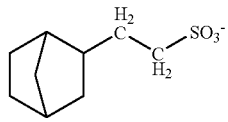

(b-6-5)

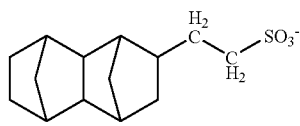

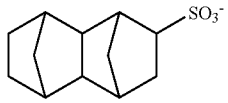
(b-6-6)

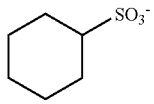
(b-6-7)

Of these, when $R^{10"}$ is a cyclic hydrocarbon group, the anion moiety (sulfonic acid ion) is preferably one that is represented by chemical formula (b-6-1) or (b-6-2) above.

With respect to the hydrocarbon group for $R^{10"}$, examples of aromatic hydrocarbon groups include a phenyl group, a tolyl group, a xylyl group, a mesityl group, a phenethyl group, and a naphthyl group.

As described above, the aromatic hydrocarbon groups may or may not have a substituent.

With respect to the anion moiety represented by general formula (b-6) above, when $R^{10"}$ is an aromatic hydrocarbon group, suitable examples of anion moieties (sulfonic acid ions) include those represented by general formula (b-7) or (b-8) shown below.

[Chemical Formula 20]

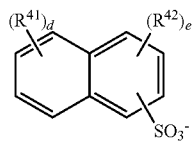
(b-7)

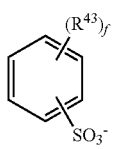
(b-8)

[In formula (b-7), $R^{41}$ and $R^{42}$ each independently represents a lower alkyl group or alkoxy group of 1 to 5 carbon atoms; and d and e each independently represents an integer of 0 to 4; and in formula (b-8), $R^{43}$ represents a lower alkyl group or alkoxy group of 1 to 5 carbon atoms; and f represents an integer of 0 to 3].

In formula (b-7) above, $R^{41}$ and $R^{42}$ each independently represents a lower alkyl group of 1 to 5 carbon atoms or an alkoxy group of 1 to 5 carbon atoms.

Examples of the lower alkyl group for $R^{41}$ and $R^{42}$ include a methyl group, an ethyl group, a propyl group, an isopropyl group, an n-butyl group, an isobutyl group, a tert-butyl group, a pentyl group, an isopentyl group, and a neopentyl group, and a methyl group is particularly desirable.

Examples of the alkoxy group for $R^{41}$ and $R^{42}$ include a methoxy group, an ethoxy group, an n-propoxy group, an isopropoxy group, an n-butoxy group and a tert-butoxy group, and a methoxy group or an ethoxy group is particularly desirable.

d and e each independently represents an integer of 0 to 4, preferably 0 to 2, and most preferably 0.

When d and/or e represent an integer of 2 or more so that a plurality of e and/or $R^{42}$ are present, the plurality of e and/or $R^{42}$ may be the same or different.

In formula (b-8) above, $R^{43}$ represents a lower alkyl group of 1 to 5 carbon atoms or an alkoxy group of 1 to 5 carbon atoms.

Examples of the lower alkyl group for $R^{43}$ include a methyl group, an ethyl group, a propyl group, an isopropyl group, an n-butyl group, an isobutyl group, a tert-butyl group, a pentyl group, an isopentyl group, and a neopentyl group, and a methyl group is particularly desirable.

Examples of the alkoxy group for $R^{43}$ include a methoxy group, an ethoxy group, an n-propoxy group, an isopropoxy group, an n-butoxy group and a tert-butoxy group, and a methoxy group or an ethoxy group is particularly desirable.

f represents an integer of 0 to 3, preferably 1 or 2, and most preferably 1.

When f represents an integer of 2 or more so that a plurality of $R^{43}$ are present, the plurality of $R^{43}$ may be the same or different.

In the present invention, with respect to the anion moiety represented by general formula (b-6) above, those in which $R^{10"}$ is a linear or branched alkyl group or an aromatic hydrocarbon group are particularly desirable.

As the cation moiety to serve as an counterion of the anion moiety represented by general formula (b-6) above, there is no particular limitation, and the same cation moieties as those of acid generators which have conventionally been proposed, such as a cation moiety of an onium salt-based acid generator, can be used. As such cation moieties, the cation moiety represented by general formula (b'-1) or (b'-2) above is particularly desirable.

Specific examples of the component (B1-ii) are shown below.

[Chemical Formula 21]

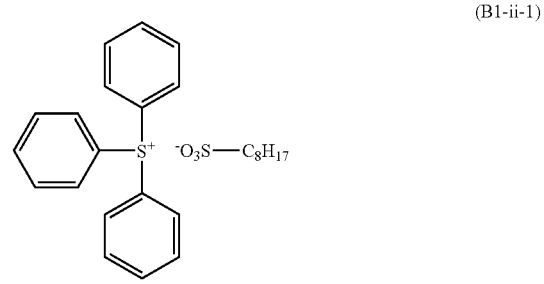
(B1-ii-1)

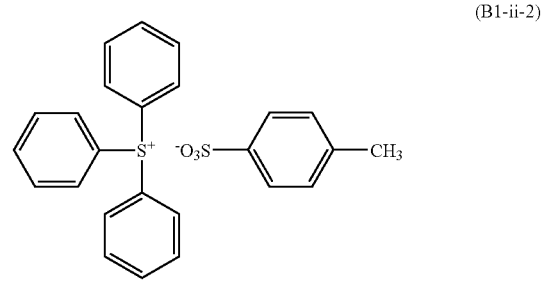
(B1-ii-2)

(B1-ii-3)

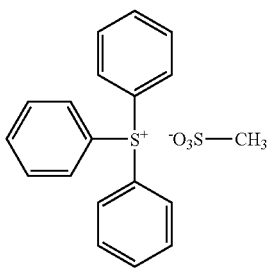

(B1-ii-4)

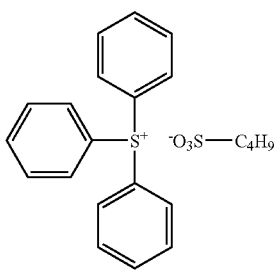

(B1-ii-5)

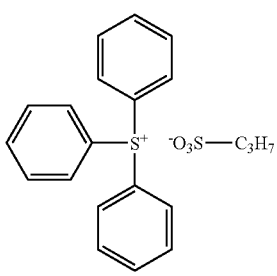

(B1-ii-6)

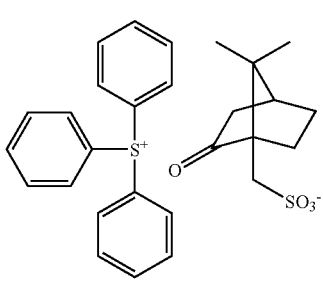

In the present invention, it is particularly desirable that the component (B1-ii) be at least one acid generator selected from the group consisting of acid generators represented by chemical formulas (B1-ii-1) to (B1-ii-6) above.

As the component (B1-ii), one type of acid generator may be used alone, or two or more types may be used in combination.

In the positive resist composition of the present invention, when the component (B) contains the component (B1-ii), the amount of the component (B1-ii) based on the entire component (B) is preferably 40% by weight or more, more preferably 70% by weight or more, still more preferably 80% by weight or more, and may be even 100% by weight. It is particularly desirable that the content of the component (B1-ii) be 100% by weight. By making the amount of the component (B1-ii) at least as large as the lower limit of the above-mentioned range, the effects of the present invention are improved. In particular, a resist pattern having an excellent shape can be easily obtained.

Further, in the positive resist composition of the present invention, when the component (B) contains the component (B1-ii), the amount of the component (B1-ii) is preferably 1 to 30 parts by weight, more preferably 2 to 15 parts by weight, and most preferably 5 to 15 parts by weight, relative to 100 parts by weight of the component (A). By making the amount of the component (B1-ii) at least as large as the lower limit of the above-mentioned range, the effects of the present invention are improved. In particular, the resist patterns having an excellent shape are easily obtained. On the other hand, by making the amount of the component (B1-ii) no more than the upper limit of the above-mentioned range, the storage stability becomes more satisfactory.

[Component (B1-iii)]

As described above, the component (B1-iii) is an acid generator having a cation moiety represented by general formula (b'-3) above.

In general formula (b'-3) above, $R^{7\prime\prime\prime}$ to $R^{9\prime\prime\prime}$ each independently represents a phenyl group or naphthyl group that may or may not have a substituent.

With respect to $R^{7\prime\prime\prime}$ to $R^{9\prime\prime\prime}$, examples of the substituent include an alkyl group, an alkoxy group, and a halogen atom, and a part or all of the hydrogen atoms of the phenyl group or naphthyl group may be substituted with the substituent.

The alkyl group, with which hydrogen atoms of the phenyl group or naphthyl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the phenyl group or naphthyl group may be substituted, is preferably an alkoxy group having 1 to 5 carbon atoms, and most preferably a methoxy group or an ethoxy group.

The halogen atom, with which hydrogen atoms of the phenyl group or naphthyl group may be substituted, is preferably a fluorine atom.

With respect to $R^{7\prime\prime\prime}$ to $R^{9\prime\prime\prime}$, the case where all of $R^{7\prime\prime\prime}$ to $R^{9\prime\prime\prime}$ represent phenyl groups which do not have a substituent is excluded.

As the anion moiety within the component (B1-iii), there is no particular limitation, and any anion moiety can be appropriately used which is known as an anion moiety of an onium salt-based acid generator.

For example, an anion moiety represented by general formula: $R^{14}SO_3^-$ (wherein $R^{14}$ represents a linear, branched or cyclic alkyl group or a fluorinated alkyl group), an anion moiety represented by general formula (b-3) above, an anion moiety represented by general formula (b-4) above, or the like can be used.

In general formula: $R^{14}SO_3^-$ above, $R^{14}$ represents a linear, branched or cyclic alkyl group or a fluorinated alkyl group.

The linear or branched alkyl group for $R^{14}$ preferably has 1 to 10 carbon atoms, more preferably 1 to 8 carbon atoms, and most preferably 1 to 4 carbon atoms.

The cyclic alkyl group for $R^{14}$ preferably has 4 to 15 carbon atoms, more preferably 4 to 10 carbon atoms, and most preferably 6 to 10 carbon atoms.

The fluorinated alkyl group for $R^{14}$ preferably has 1 to 10 carbon atoms, more preferably 1 to 8 carbon atoms, and most preferably 1 to 4 carbon atoms. Further, the fluorination ratio of the fluorinated alkyl group (percentage of fluorine atoms within the alkyl group, and the same applies to the fluorination ratio described below) is preferably from 10 to 100%, more preferably from 50 to 100%, and it is particularly desirable that all hydrogen atoms are substituted with fluorine atoms because the acid strength increases.

$R^{14}$ is more preferably a linear or cyclic alkyl group or a fluorinated alkyl group.

The anion moiety of the component (B1-iii) is preferably an anion moiety represented by general formula: $R^{14}SO_3^-$ above, and those in which $R^{14}$ is a fluorinated alkyl group are more preferable.

Specific examples of the component (B1-iii) are shown below.

[Chemical Formula 22]

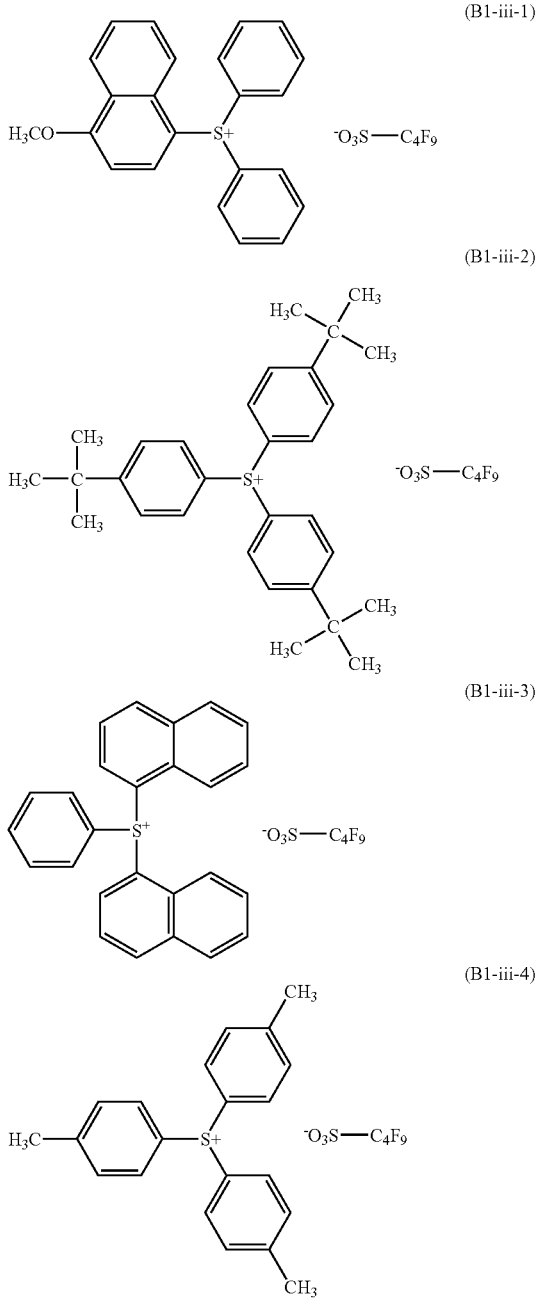

In the present invention, it is particularly desirable that the component (B1-iii) be at least one acid generator selected from the group consisting of acid generators represented by chemical formulas (B1-iii-1) to (B1-iii-4) above.

As the component (B1-iii), one type of acid generator may be used alone, or two or more types may be used in combination.

In the positive resist composition of the present invention, when the component (B) contains the component (B1-iii), the amount of the component (B1-iii) based on the entire component (B) is preferably 40% by weight or more, more preferably 70% by weight or more, still more preferably 80% by weight or more, and may be even 100% by weight. It is particularly desirable that the content of the component (B1-iii) be 100% by weight. By making the amount of the component (B1-iii) at least as large as the lower limit of the above-mentioned range, a resist pattern having an excellent shape can be easily obtained.

Further, in the positive resist composition of the present invention, when the component (B) contains the component (B1-iii), the amount of the component (B1-iii) is preferably 1 to 40 parts by weight, more preferably 5 to 25 parts by weight, and most preferably 10 to 20 parts by weight, relative to 100 parts by weight of the component (A). By making the amount of the component (B1-iii) at least as large as the lower limit of the above-mentioned range, a resist pattern having an excellent shape can be easily obtained. On the other hand, by making the amount of the component (B1-iii) no more than the upper limit of the above-mentioned range, the storage stability becomes more satisfactory.

In the component (B), an acid generator (B2) other than the aforementioned component (B1-i), component (B1-ii), and component (B1-iii) (hereafter, referred to as "component (B2)") may be used in combination with the component (B1-i), component (B1-ii), or component (B1-iii).

As the component (B2), there is no particular limitation as long as it is an acid generator other than the component (B1-i), component (B1-ii), or component (B1-iii), and any of the known acid generators used in conventional chemically amplified resist compositions can be used.

Examples of the component (B2) are numerous, and include onium salt-based acid generators such as iodonium salts containing fluorine atoms and sulfonium salts containing fluorine atoms; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator, a compound represented by general formula (b-0) shown below can be preferably used.

[Chemical Formula 23]

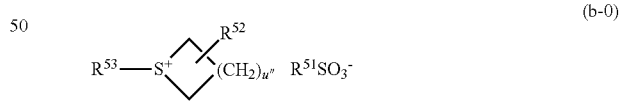

[wherein $R^{51}$ represents a linear, branched or cyclic fluorinated alkyl group; $R^{52}$ represents a hydrogen atom, a hydroxyl group, a halogen atom, a linear or branched alkyl group, a linear or branched halogenated alkyl group, or a linear or branched alkoxy group; $R^{53}$ represents an aryl group which may have a substituent; and u" represents an integer of 1 to 3.]

In general formula (b-0), $R^{51}$ represents a linear, branched or cyclic fluorinated alkyl group.

The fluorinated alkyl group is a group in which a part or all of the hydrogen atoms of the linear, branched or cyclic fluorinated alkyl group have been substituted with fluorine atoms.

With respect to the fluorinated alkyl group, the linear or branched alkyl group preferably has 1 to 10 carbon atoms, more preferably 1 to 8 carbon atoms, and most preferably 1 to 4 carbon atoms.

With respect to the fluorinated alkyl group, the cyclic alkyl group preferably has 4 to 12 carbon atoms, more preferably 5 to 10 carbon atoms, and most preferably 6 to 10 carbon atoms.

Further, the fluorination ratio of the fluorinated alkyl group (percentage of the number of fluorine atoms substituting the hydrogen atoms, based on the total number of all hydrogen atoms within the alkyl group) is preferably from 10 to 100%, more preferably from 50 to 100%, and it is particularly desirable that all of the hydrogen atoms are substituted with fluorine atoms, as the acid strength increases. The fluorination ratio of 10% or more is preferable because the strength of the acid generated from the component (B2) increases.

$R^{51}$ is most preferably a linear fluorinated alkyl group.

$R^{52}$ represents a hydrogen atom, a hydroxyl group, a halogen atom, a linear or branched alkyl group, a linear or branched halogenated alkyl group, or a linear or branched alkoxy group.

Examples of the halogen atom for $R^{52}$ include a fluorine atom, a bromine atom, a chlorine atom and an iodine atom, and a fluorine atom is preferable.

The alkyl group for $R^{52}$ is linear or branched, and preferably has 1 to 5 carbon atoms, more preferably 1 to 4 carbon atoms, and most preferably 1 to 3 carbon atoms.

The halogenated alkyl group for $R^{52}$ is a group in which a part or all of the hydrogen atoms of the alkyl group have been substituted with halogen atoms. As the alkyl group of the halogenated alkyl group, the same alkyl groups as those for $R^{52}$ may be used. As the halogen atoms for substituting the hydrogen atoms of the alkyl group, the same halogen atoms as those for $R^{52}$ may be used. In the halogenated alkyl group, it is preferable that 50 to 100% of the hydrogen atoms of the alkyl group be substituted with halogen atoms, and it is more preferable that all of the hydrogen atoms are substituted with halogen atoms.

The alkoxy group for $R^{52}$ is linear or branched, and preferably has 1 to 5 carbon atoms, more preferably 1 to 4 carbon atoms, and most preferably 1 to 3 carbon atoms.

Among these, as $R^{52}$, a hydrogen atom is particularly desirable.

$R^{53}$ represents an aryl group which may have a substituent, and is preferably an aryl group of 6 to 20 carbon atoms, and examples of the basic ring excluding the substituent include a naphthyl group, a phenyl group and an anthracenyl group. In terms of the effects of the present invention and absorption of exposure ray such as ArF excimer laser, a phenyl group is preferable.

Examples of substituents include a hydroxyl group and a lower alkyl group (linear or branched, and preferably has no more than 5 carbon atoms, and a methyl group is particularly desirable).

As the aryl group for $R^{53}$, those which do not have a substituent are preferable.

u" is an integer of 1 to 3, preferably 2 or 3, and it is particularly desirable that u" be 3.

As preferable examples of acid generators represented by general formula (b-0), the following can be shown.

[Chemical Formula 24]

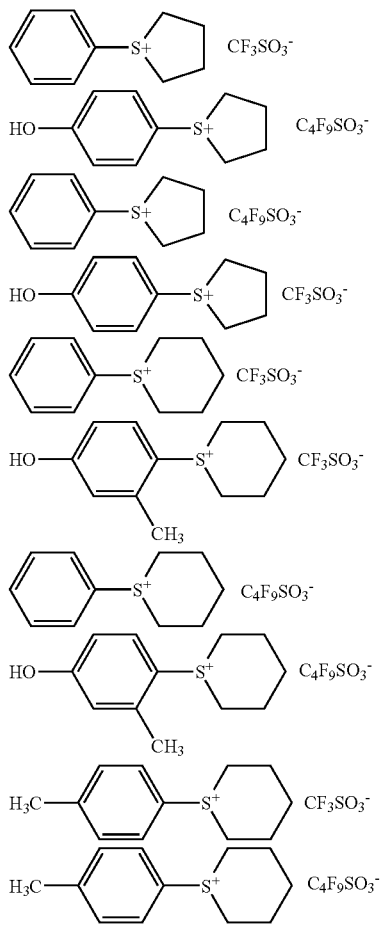

As an onium salt-based acid generator other than those represented by general formula (b-0), a compound represented by general formula (b-1) or (b-2) shown below can be preferably used.

[Chemical Formula 25]

(b-1)

(b-2)

wherein $R^{1"}$ to $R^{3"}$, $R^{5"}$ and $R^{6"}$ each independently represents an aryl group or alkyl group; and $R^{4"}$ represents a linear, branched or cyclic fluorinated alkyl group, with the proviso that at least one of $R^{1"}$ to $R^{3"}$ represents an aryl group, and at least one of $R^{5"}$ and $R^{6"}$ represents an aryl group.

In general formula (b-1), $R^{1"}$ to $R^{3"}$ are respectively as defined for $R^{1"}$ to $R^{3"}$ in general formula (b'-1) above.

In general formula (b-2), $R^{5"}$ and $R^{6"}$ are respectively as defined for $R^{5"}$ and $R^{6"}$ in general formula (b'-2) above.

R⁴" represents a linear, branched or cyclic fluorinated alkyl group.

As the fluorinated alkyl group, the same groups as the linear, branched or cyclic fluorinated alkyl group for $R^{51}$ above can be used. $R^{4"}$ is preferably a linear or cyclic fluorinated alkyl group, more preferably a linear fluorinated alkyl group, and most preferably a linear fluorinated alkyl group of 1 to 4 carbon atoms.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; and di(1-naphthyl)phenylsulfonium trifluoromethanesulfonate, heptafluoropropanesulfonate or nonafluorobutanesulfonate.

In the present description, an oximesulfonate-based acid generator is a compound having at least one group represented by general formula (B-1) shown below, and has a feature of generating acid by irradiation. Such oximesulfonate-based acid generators are widely used for a chemically amplified resist composition, and can be appropriately selected.

[Chemical Formula 26]

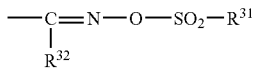

(B-1)

wherein $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 27]

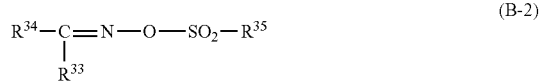

(B-2)

wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 28]

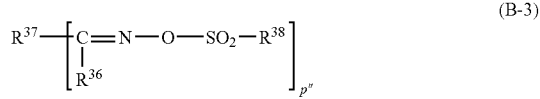

(B-3)

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2) above, the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and still more preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthracyl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a partially or completely fluorinated alkyl group is most preferable.

In terms of enhancing the strength of the acid generated, the fluorinated alkyl group for $R^{35}$ preferably has 50% or more of the hydrogen atoms fluorinated, more preferably 70% or more, and still more preferably 90% or more. A completely fluorinated alkyl group in which 100% of the hydrogen atoms are substituted with fluorine atoms is particularly desirable.

In general formula (B-3) above, the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 20041074242A2 (Examples 1 to 40 described at pages 65 to 85) may be preferably used.

Furthermore, as preferable examples, the following can be exemplified.

[Chemical Formula 29]

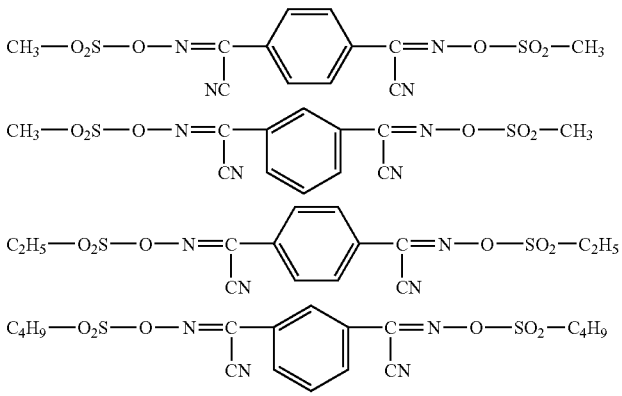

-continued
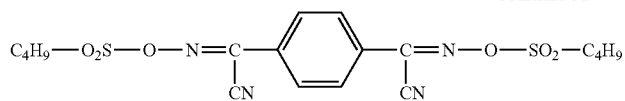
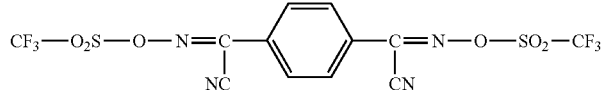
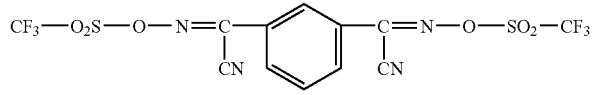
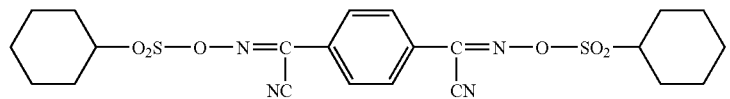
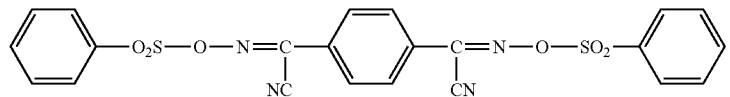
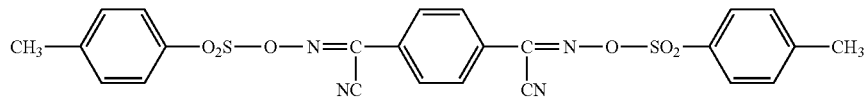
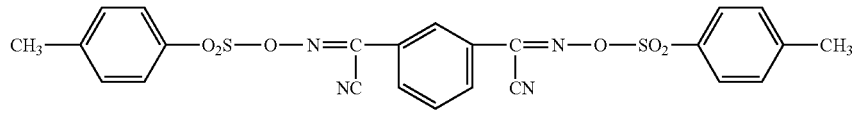
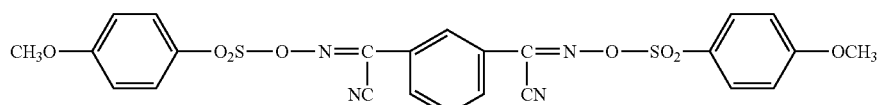
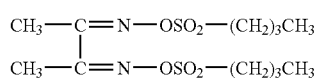
[Chemical Formula 30]
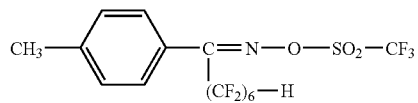
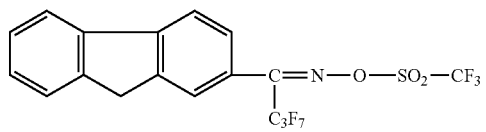
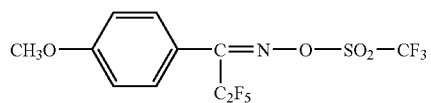
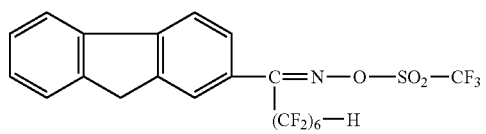
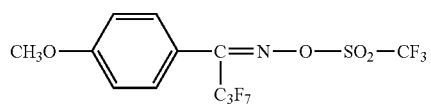
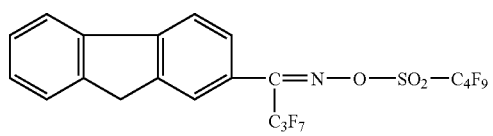
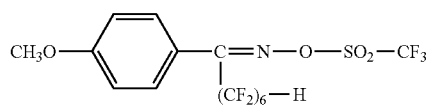
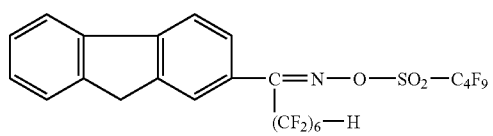
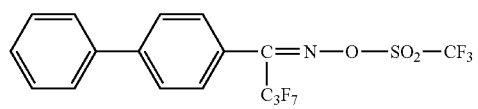
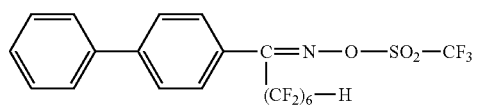
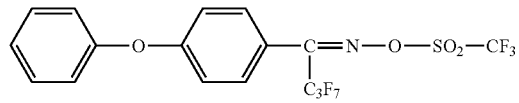
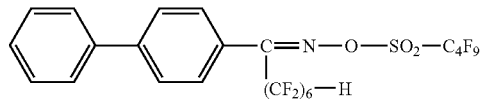

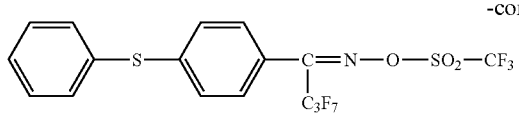
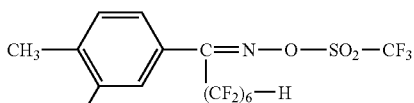

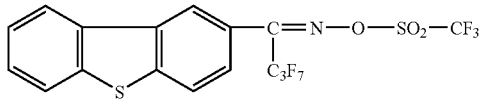
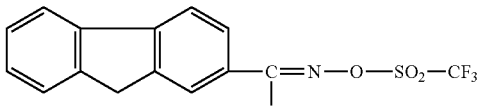

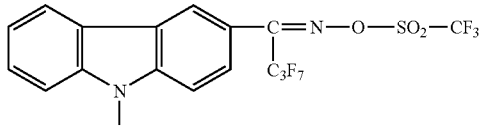
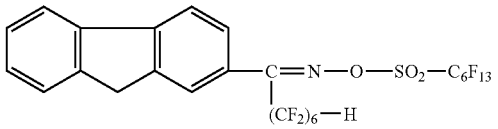

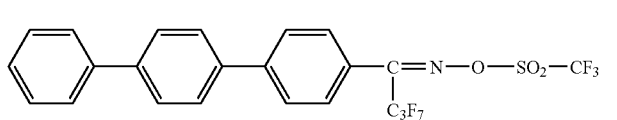
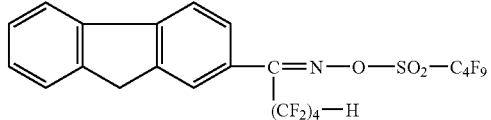

Among the above-exemplified compounds, the following 4 compounds are preferable.

[Chemical Formula 31]

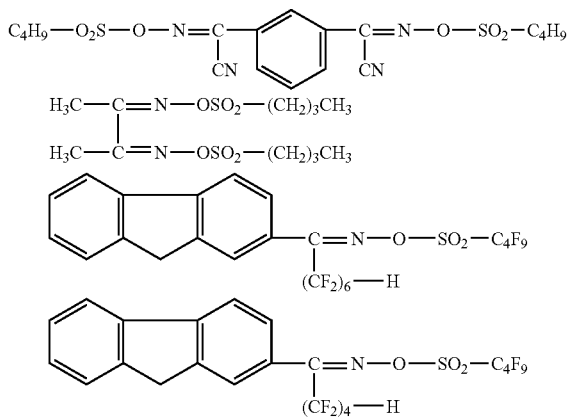

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be exemplified.

As the component (B2), it is particularly preferable to use an onium salt in which the anion moiety is a fluorinated alkylsulfonate ion.

As the component (B2), one type of the acid generators above may be used alone, or two or more types may be used in combination.

The amount of the component (B) as a whole within the positive resist composition of the present invention is preferably 0.5 to 45 parts by weight, and more preferably 5 to 30 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Component (D)>

For improving the resist pattern shape and the post exposure stability of the latent image formed by the pattern-wise exposure of the resist layer, it is preferable that the positive resist composition of the present invention further contains a nitrogen-containing organic compound (D) (hereafter referred to as the component (D)) as an optional component.

A multitude of these components (D) have already been proposed, and any of these known compounds may be used, although an aliphatic amine, and particularly a secondary aliphatic amine or tertiary aliphatic amine is preferable. In the present description and claims, the term "aliphatic" is a relative concept used in relation to the term "aromatic", and defines a group or compound that has no aromaticity.

The term "aliphatic cyclic group" refers to a monocyclic group or polycyclic group that has no aromaticity. An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-octylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Of these, one type may be used alone, or two or more types may be used in combination.

In the present invention, as the component (D), alkylamines are preferable, and it is particularly preferable to use tri-n-octylamine.

The component (D) is typically used in an amount within a range from 0.01 to 5.0 parts by weight, relative to 100 parts by weight of the component (A).

<Optional Component>

Furthermore, in the positive resist composition of the present invention, for preventing any deterioration in sensitivity, and improving the resist pattern shape and the post exposure stability of the latent image formed by the patternwise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly desirable.

Examples of phosphorus oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphoric acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferable, and salicylic acid is particularly desirable.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

The positive resist composition of the present invention can be prepared by dissolving the materials for the resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-amyl ketone, methyl isoamyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, amylbenzene, isopropylbenzene, toluene, xylene, cymene and mesitylene.

These organic solvents can be used individually, or in combination as a mixed solvent.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) used is not particularly limited, and is appropriately adjusted to a concentration which enables coating of a coating solution to a substrate, depending on the thickness of the coating film. In general, the component (S) is used in an amount such that the solid content of the resist composition becomes within the range from 2 to 20% by weight, and preferably from 5 to 15% by weight.

<<Method of Forming a Resist Pattern>>

The method of forming a resist pattern according to the present invention includes:

applying a positive resist composition of the present invention to a substrate to form a resist film on the substrate; subjecting the resist film to exposure; and developing the resist film to form a resist pattern.

More specifically, the method for forming a resist pattern according to the present invention can be performed, for example, as follows.

Firstly, the positive resist composition is applied onto a substrate such as a silicon wafer using a spinner or the like, and a prebake (post applied bake (PAB)) is conducted under temperature conditions of 80 to 150° C. for 40 to 120 seconds, preferably 60 to 90 seconds to form a resist film. Then, using an exposure apparatus or the like, the resist film is selectively exposed by irradiation with extreme ultraviolet rays (EUV), a KrF excimer laser beam, or the like through a desired mask pattern, or by direct irradiation (patterning of the resist film) with an electron beam without using a mask pattern. This is followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide.

In this manner, a resist pattern can be obtained.

An organic or inorganic antireflection film may be provided between the substrate and the applied coating layer of the resist composition.

Further, the wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is effective to the lithography processes using KrF excimer laser, EUV, or EB, and particularly effective for EUV.

By the positive resist composition and method of forming a resist pattern according to the present invention, a resist pattern with excellent resolution can be formed. The reasons for these have not yet been elucidated, but are presumed as follows.

The positive resist composition of the present invention includes the component (A) containing the structural unit (a1) which is alkali soluble and the structural unit (a2) having an acetal-type acid dissociable dissolution inhibiting group in the side chain portion of acrylic acid. In particular, the acetal-type acid dissociable dissolution inhibiting group of the structural unit (a2) exhibits a low activation energy during the deprotection reaction, and thus, is easily dissociated. For this reason, in the component (A), the rate of dissociation of the acid dissociable dissolution inhibiting groups present in the exposed portions (deprotection rate) upon exposure is high, and thus alkali solubility of the exposed portions increases considerably.

Further, the positive resist composition of the present invention includes the aforementioned component (B1-i), component (B1-ii), or component (B1-iii) as the acid generator (B).

The component (B1-i) includes an anion moiety having a three-dimensionally bulky structure (the anion moiety represented by general formula (b-3), (b-4), or (b-5) above). It is presumed that by virtue of such a structure, as compared to an acid generator having a conventional anion moiety such as nonafluorobutanesulfonate, the concentration of the acid generator within the resist film can be increased. Further, the diffusion length of the acid generated from the component (B1-i) within the film is short. Therefore, the acid generation can be appropriately controlled to make it efficient.

The component (B1-ii) includes an anion moiety containing a hydrocarbon group and having relatively high hydrophobicity (the anion moiety represented by general formula (b-5) above). As a result, it is presumed that the component (B1-ii) can be more easily dispersed uniformly within the resist film than acid generators with conventional anion moieties such as nonafluorobutanesulfonate, and thus the acid generated upon exposure is more uniformly dispersed within the resist film. Further, by virtue of using the component (B1-ii) that includes an anion moiety containing a hydrocarbon group, the positive resist composition of the present invention can offer higher levels of safety, as compared to conventional positive resist compositions.

The component (B1-iii) includes a cation moiety represented by general formula (b'-3) above. As a result, it is presumed that the solubility of the exposed portions of resist films in an alkali developing solution is moderately suppressed.

Therefore, it is presumed that according to the positive resist composition of the present invention which includes the component (A), and the component (B1-i), component (B1-ii), or component (B1-iii), the difference in alkali solubility between the exposed portions and the unexposed portions (the dissolution contrast) increases considerably, as compared to the case where the conventional positive resist compositions are used, and a resist pattern with minimal surface roughness or the like can be easily formed. As a result, a resist pattern having excellent resolution, high rectangularity, and excellent shape can be formed without causing the rounding within the top portions of the resist pattern or the swelling of the resist pattern surface.

Further, according to the present invention, a resist pattern having an excellent shape is obtained.

For example, a resist pattern with minimal surface roughness can be formed.

Roughness has the potential to adversely affect the formation of very fine semiconductor elements. For example, roughness on the side wall surfaces of a resist pattern, the so-called line edge roughness (LER), can cause distortions around the holes in hole patterns, and fluctuation in the line width of line and space patterns. This problem of roughness becomes more significant as the pattern dimensions are reduced. Since the lithography processes using electron beams or EUV or the like are targeting the formation of very fine patterns with dimensions of several tens of nanometers, the improvement in roughness becomes extremely important.

Furthermore, in the present invention, a resist pattern with minimal thickness loss can be formed. The term "thickness loss" refers to the difference in the resist film thickness before and after the developing process, and the resist film becomes more useful for the process, in which etching is conducted using the resist pattern as a mask, as the level of thickness loss reduces.

As described above, it is presumed that these effects are achieved due to the improvements in the dissolution contrast.

EXAMPLES

As follows is a description of examples of the present invention, although the scope of the present invention is by no way limited by these examples.

In Examples 1 to 8 and Comparative Examples 1 to 3 described below, a resin (A)-1 synthesized by copolymerizing the following monomers (1) and (2) by a conventional dropwise polymerization method was used.

Specifically, the resin (A)-1 was synthesized as follows. Propylene glycol monomethyl ether acetate (PGMEA) was charged into a flask equipped with an inlet for nitrogen, a stirrer, a condenser and a thermometer in a nitrogen atmosphere, and the temperature of the water bath was elevated to 80° C. while stirring. Then, 2,2'-azobisisobutyronitrile (AIBN) as a polymerization initiator and a PGMEA monomer solution obtained by mixing monomers (1) and (2) with PGMEA so that the ratio of the monomers within the solution was monomer (1)/monomer (2)=3/1 (molar ratio), were dropwise added into the flask using a dripping apparatus at a constant rate over 6 hours, and then the temperature was maintained at 80° C. for 1 hour.

Subsequently, the temperature of the reaction liquid was cooled to room temperature. Then, the resulting reaction liquid was dropwise added to methanol about 30 times in amount while stirring, to obtain a colorless precipitate. The obtained precipitate was separated by filtration, and the precipitate was washed in methanol in an amount about 30 times the amount of the monomers used in the polymerization. The resulting precipitate was separated by filtration, and the precipitate was dissolved in tetrahydrofuran (THF). An 80% by weight aqueous solution of hydrazine was dropwise added to the obtained THF solution, followed by stirring at 25° C. for 1 hour. Following the completion of the reaction, the resulting reaction liquid was dropwise added to an excess amount of water to obtain a precipitate. The resulting precipitate was separated by filtration, followed by washing, and drying under reduced pressure at 50° C. for about 40 hours, thereby obtaining the resin (A)-1.

[Chemical Formula 32]

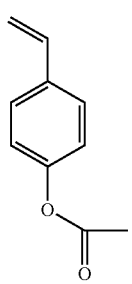

Monomer (1)

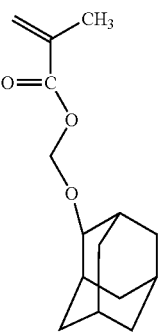

Monomer (2)

The structure of the resin (A)-1 is shown below.

[Chemical Formula 33]

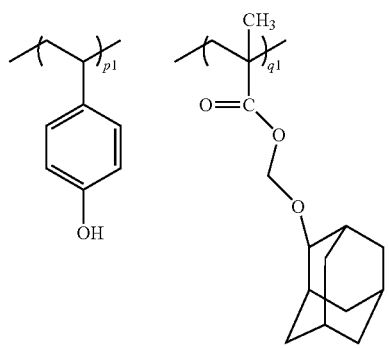

[p1/q1=75/25 (molar ratio); Mw=7,000; Mw/Mn=1.7]

Examples 1 to 3, Comparative Example 1

The components shown in Table 1 were mixed together and dissolved to obtain positive resist compositions.

TABLE 1

| | Component (A) | Component (B) | Component (D) | Component (E) | Component (S) |
|---|---|---|---|---|---|
| Ex. 1 | (A)-1 [100] | (B)-1 [12.4] | (D)-1 [0.38] | (E)-1 [0.15] | (S)-1 [2400] |
| Ex. 2 | (A)-1 [100] | (B)-2 [12.6] | (D)-1 [0.38] | (E)-1 [0.15] | (S)-1 [2400] |
| Ex. 3 | (A)-1 [100] | (B)-3 [13.3] | (D)-1 [0.38] | (E)-1 [0.15] | (S)-1 [2400] |
| Comp. Ex. 1 | (A)-1 [100] | (B)-4 [12.6] | (D)-1 [0.38] | (E)-1 [0.15] | (S)-1 [2400] |

In Table 1, the reference characters indicate the following. Further, the values in brackets [ ] indicate the amount (in terms of parts by weight) of the component added.

(B)-1: a compound represented by formula (b-3-1) shown below (B)-2: a compound represented by formula (b-5-1) shown below (B)-3: a compound represented by formula (b-4-1) shown below (B)-4: a compound represented by formula (B)-4 shown below

[Chemical Formula 34]

(b-3-1)
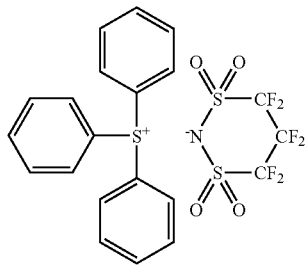

(b-5-1)
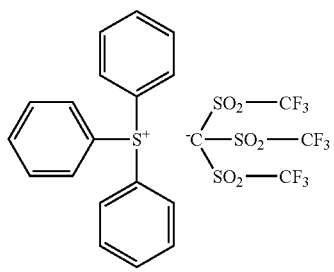

(b-4-1)
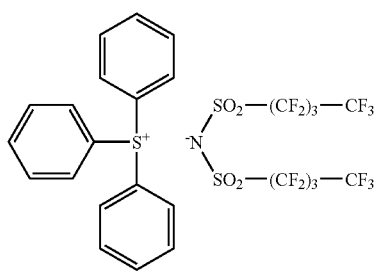

(B)-4
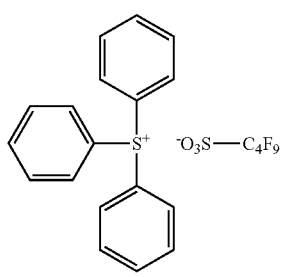

(D)-1: tri-n-octylamine
(E)-1: salicylic acid
(S)-1: PGMEA

Each of the positive resist compositions obtained above was applied uniformly to the surface of an 8-inch silicon substrate that had been surface treated with hexamethyldisilazane (HMDS), and was then subjected to a prebake treatment (PAB) at a temperature indicated in Table 2 for 90 seconds, thereby forming a resist film with a film thickness of 100 nm.

The obtained resist film was then subjected to direct patterning with an electron beam lithography apparatus (product name: HL-800D, manufactured by Hitachi Ltd.) at an accelerating voltage of 70 kV, and was then subjected to a post exposure bake (PEB) treatment at a PEB temperature indicated in Table 2 for 90 seconds, developed for 60 seconds at 23° C. in a 2.38% by weight aqueous solution of tetramethylammonium hydroxide (TMAH), and rinsed in pure water for 15 seconds, followed by drying by shaking, thereby forming a line and space (1:1) resist pattern (hereafter referred to as an L/S pattern).

The optimum exposure dose (Eop, $\mu C/cm^2$) for forming a L/S pattern having a line width of 100 nm and a pitch of 200 nm was determined and the critical resolution at the Eop was determined.

The results are shown in Table 2.

TABLE 2

|  | PAB Temperature (° C.) | PEB Temperature (° C.) | EOP ($\mu C/cm2$) | Critical Resolution (nm) |
| --- | --- | --- | --- | --- |
| Ex. 1 | 120 | 120 | 16 | 60 |
| Ex. 2 | 120 | 120 | 18 | 60 |
| Ex. 3 | 120 | 120 | 17 | 60 |
| Comp. Ex. 1 | 120 | 120 | 16 | 70 |

As seen from the results shown in Table 2, it was confirmed that the resist patterns formed in Examples 1 to 3 using positive resist compositions according to the present invention exhibited excellent resolution, as compared to the resist pattern formed by using the positive resist composition of Comparative Example 1.

Examples 4 and 5, Comparative Example 2

The components shown in Table 3 were mixed together and dissolved to obtain positive resist compositions.

TABLE 3

|  | Component (A) | Component (B) | Component (D) | Component (E) | Component (S) |
| --- | --- | --- | --- | --- | --- |
| Ex. 4 | (A)-1 [100] | (B)-5 [9.7] | (D)-1 [0.38] | (E)-1 [0.15] | (S)-2 [2400] |
| Ex. 5 | (A)-1 [100] | (B)-6 [10.2] | (D)-1 [0.38] | (E)-1 [0.15] | (S)-2 [2400] |
| Comp. Ex. 2 | (A)-1 [100] | (B)-4 [12.6] | (D)-1 [0.38] | (E)-1 [0.15] | (S)-2 [2400] |

In Table 3, the reference characters indicate the following. Further, the values in brackets [ ] indicate the amount (in terms of parts by weight) of the component added.

(B)-5: a compound represented by formula (B1-ii-2) shown below (B)-6: a compound represented by formula (B1-ii-1) shown below (B)-4: a compound represented by formula (B)-4 shown below

[Chemical Formula 35]

(B1-ii-2)
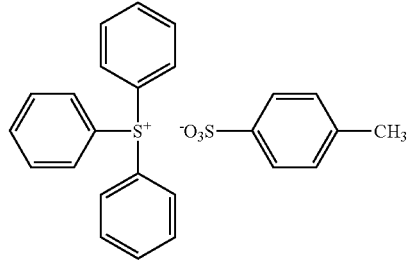

-continued

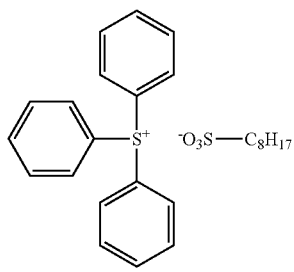
(B1-ii-1)

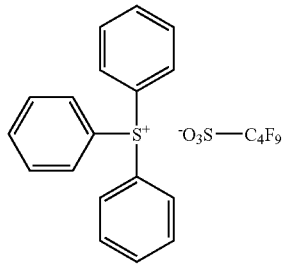
(B)-4

(D)-1: tri-n-octylamine
(E)-1: salicylic acid
(S)-2: a mixed solvent of PGMEA/PGME=6/4 (weight ratio)

Each of the positive resist compositions obtained above was applied uniformly to the surface of an 8-inch silicon substrate that had been surface treated with hexamethyldisilazane (HMDS), and was then subjected to a prebake treatment (PAB) at a temperature indicated in Table 4 for 90 seconds, thereby forming a resist film with a film thickness of 100 nm.

The obtained resist film was then subjected to direct patterning with an electron beam lithography apparatus (product name: HL-800D, manufactured by Hitachi Ltd.) at an accelerating voltage of 70 kV, and was then subjected to a post exposure bake (PEB) treatment at a PEB temperature indicated in Table 4 for 90 seconds, developed for 60 seconds at 23° C. in a 2.38% by weight aqueous solution of tetramethylammonium hydroxide (TMAH), and rinsed in pure water for 15 seconds, followed by drying by shaking, thereby forming a line and space (1:1) resist pattern (hereafter referred to as an L/S pattern).

The optimum exposure dose (Eop, µC/cm²) for forming a L/S pattern having a line width of 100 nm and a pitch of 200 nm was determined and the critical resolution at the Eop was determined.

The results are shown in Table 4.

TABLE 4

|  | PAB Temperature (° C.) | PEB Temperature (° C.) | EOP (µC/cm2) | Critical Resolution (nm) |
|---|---|---|---|---|
| Ex. 4 | 110 | 115 | 12 | 50 |
| Ex. 5 | 110 | 115 | 12 | 50 |
| Comp. Ex. 2 | 120 | 120 | 16 | 70 |

As seen from the results shown in Table 4, it was confirmed that the resist patterns formed in Examples 4 and 5 using positive resist compositions according to the present invention exhibited excellent resolution, as compared to the resist pattern formed by using the positive resist composition of Comparative Example 2.

Further, the cross-sectional shape of the formed L/S patterns was observed by a scanning electron microscope (SEM). As a result, it was confirmed that the resist patterns formed in Examples 4 and 5 had an excellent shape, because the shape of the L/S patterns of Examples 4 and 5 were superior to the L/S pattern of Comparative Example 2 in that unevenness of the side walls of a line pattern or unevenness of the pattern surface (upper face of the pattern) was minimal.

Examples 6 to 8, Comparative Example 3

The components shown in Table 5 were mixed together and dissolved to obtain positive resist composition solutions.

TABLE 5

|  | Component (A) | Component (B) | Component (D) | Component (E) | Component (S) |
|---|---|---|---|---|---|
| Ex. 6 | (A)-1 | (B)-7 | (D)-1 | (E)-1 | (S)-2 |
|  | [100] | [14.4] | [0.38] | [0.15] | [2400] |
| Ex. 7 | (A)-1 | (B)-8 | (D)-1 | (E)-1 | (S)-2 |
|  | [100] | [16.4] | [0.38] | [0.15] | [2400] |
| Ex. 8 | (A)-1 | (B)-9 | (D)-1 | (E)-1 | (S)-2 |
|  | [100] | [14.8] | [0.38] | [0.15] | [2400] |
| Comp. Ex. 3 | (A)-1 | (B)-4 | (D)-1 | (E)-1 | (S)-2 |
|  | [100] | [12.6] | [0.38] | [0.15] | [2400] |

In Table 5, the reference characters indicate the following. Further, the values in brackets [ ] indicate the amount (in terms of parts by weight) of the component added.

(B)-7: a compound represented by formula (B1-iii-1) shown below (B)-8: a compound represented by formula (B1-iii-2) shown below (B)-9: a compound represented by formula (B1-iii-3) shown below (B)-4: a compound represented by formula (B)-4 shown below

[Chemical Formula 36]

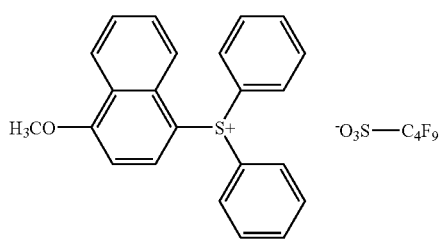
(B1-iii-1)

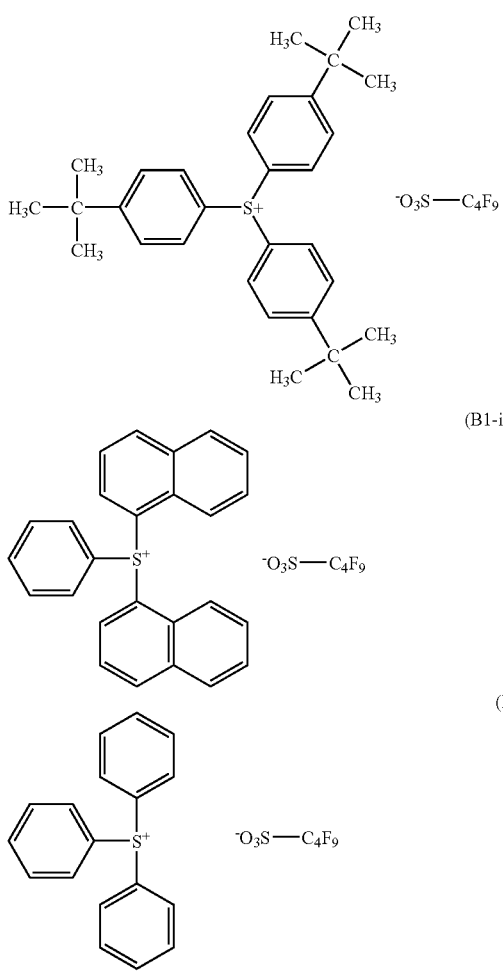

(D)-1: tri-n-octylamine
(E)-1: salicylic acid
(S)-2: a mixed solvent of PGMEA/PGME=6/4 (weight ratio)

Each of the positive resist compositions obtained above was applied uniformly to the surface of an 8-inch silicon substrate that had been surface treated with hexamethyldisilazane (HMDS), and was then subjected to a prebake treatment (PAB) at a temperature indicated in Table 6 for 90 seconds, thus forming a resist film with a film thickness of 100 nm.

The obtained resist film was then subjected to direct patterning with an electron beam lithography apparatus (product name: HL-800D, manufactured by Hitachi Ltd.) at an accelerating voltage of 70 kV, and was then subjected to a post exposure bake (PEB) treatment at a PEB temperature indicated in Table 6 for 90 seconds, developed for 60 seconds at 23° C. in a 2.38% by weight aqueous solution of tetramethylammonium hydroxide (TMAH), and rinsed in pure water for 15 seconds, followed by drying by shaking, thereby forming a 100 nm line and space (1:1) resist pattern (hereafter referred to as an L/S pattern).

The optimum exposure dose (Eop, $\mu C/cm^2$) for forming a L/S pattern having a line width of 100 nm and a pitch of 200 nm was determined. The cross-sectional shape of the formed L/S patterns was observed using a measuring SEM (product name: S-9220, manufactured by Hitachi, Ltd.). The results are shown in Table 6.

TABLE 6

| | PAB Temperature (° C.) | PEB Temperature (° C.) | EOP ($\mu C/cm2$) | Resist Pattern Shape |
|---|---|---|---|---|
| Ex. 6 | 120 | 115 | 19 | Top portions of |
| Ex. 7 | 130 | 115 | 18 | the resist |
| Ex. 8 | 130 | 115 | 17 | pattern had excellent shape High rectangularity |
| Comp. Ex. 3 | 120 | 120 | 16 | Rounding of the top portions of the resist pattern Low rectangularity |

As seen from the results shown in Table 6, it was confirmed that the resist patterns formed in Examples 6 to 8 using resist compositions according to the present invention had an excellent shape as compared to the L/S pattern of Comparative Example 3.

Moreover, in the formation of a resist pattern, it was confirmed that the thickness loss was minimal when the positive resist compositions of Examples 6 to 8 according to the present invention were used, as compared to the positive resist composition of Comparative Example 3.

INDUSTRIAL APPLICABILITY

According to the present invention, a resist pattern having excellent resolution with minimal surface roughness and thickness loss can be formed. Therefore, the present invention is extremely useful in industry.

The invention claimed is:

1. A positive resist composition comprising a resin component (A) which exhibits increased alkali solubility under action of acid and an acid-generator component (B) which generates acid upon exposure, said resin component (A) comprising a structural unit (a1) derived from hydroxystyrene, and a structural unit (a2) represented by general formula (a2-1) or (a2-2) shown below:

[Chemical Formula 1]

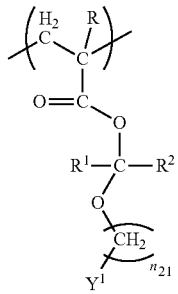

(a2-1)

-continued

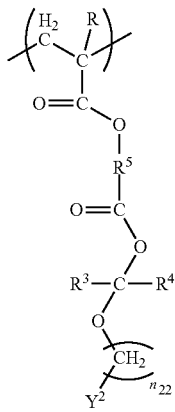
(a2-2)

wherein:

in general formula (a2-1), R represents a hydrogen atom, a halogen atom, a lower alkyl group or a halogenated lower alkyl group; $R^1$ and $R^2$ each independently represents a hydrogen atom or a lower alkyl group; $Y^1$ represents a lower alkyl group or a monovalent aliphatic cyclic group; and $n_{21}$ represents an integer of 0 to 3, and in general formula (a2-2), R is as defined above; $R^3$ and $R^4$ each independently represents a hydrogen atom or a lower alkyl group; $R^5$ represents an alkylene group or a divalent aliphatic cyclic group; $Y^2$ represents a lower alkyl group or a monovalent aliphatic cyclic group; and $n_{22}$ represents an integer of 0 to 3, and said acid-generator component (B) comprising an acid generator (B1-i) having at least one anion moiety selected from the group consisting of anion moieties represented by general formulas (b-3), (b-4), and (b-5) shown below:

[Chemical Formula 2]

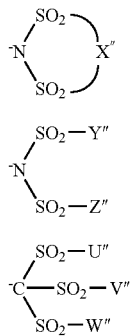

wherein:

in formula (b-3), X" represents an alkylene group of 2 to 6 carbon atoms in which at least one hydrogen atom has been substituted with a fluorine atom, in formula (b-4), Y" and Z" each independently represents an alkyl group of 1 to 10 carbon atoms in which at least one hydrogen atom has been substituted with a fluorine atom, and in formula (b-5), U", V", and W" each independently represents an alkyl group of 1 to 10 carbon atoms in which at least one hydrogen atom has been substituted with a fluorine atom, an acid generator (B1-ii) having an anion moiety represented by general formula (b-6) shown below:

[Chemical Formula 3]

$$R^{10"}-SO_3^- \quad (b-6)$$

wherein:

in formula (b-6), $R^{10"}$ represents a hydrocarbon group which may or may not have a substituent, or an acid generator (B1-iii) having a cation moiety represented by general formula (b'-3) shown below:

[Chemical Formula 4]

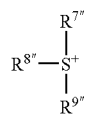
(b'-3)

wherein:

in formula (b'-3), $R^{7"}$ to $R^{9"}$ each independently represents a phenyl group or naphthyl group that may or may not have a substituent; with the proviso that the case where all of $R^{7"}$ to $R^{9"}$ represent phenyl groups which do not have a substituent is excluded.

2. The positive resist composition according to claim 1, wherein the amount of said component (B1-i) is within a range of 1 to 40 parts by weight, relative to 100 parts by weight of said resin component (A).

3. The positive resist composition according to claim 1, wherein the amount of said component (B1-ii) is within a range of 1 to 30 parts by weight, relative to 100 parts by weight of said resin component (A).

4. The positive resist composition according to claim 1, wherein the amount of said component (B1-iii) is within a range of 1 to 40 parts by weight, relative to 100 parts by weight of said resin component (A).

5. The positive resist composition according to claim 1, which further comprises a nitrogen-containing organic compound (D).

6. A method of forming a resist pattern, comprising:
applying a positive resist composition of any one of claims 1 to 5 to a substrate to form a resist film on the substrate;
subjecting said resist film to exposure; and
developing said resist film to form a resist pattern.

* * * * *

UNITED STATES PATENT AND TRADEMARK OFFICE
CERTIFICATE OF CORRECTION

PATENT NO.        : 7,914,968 B2
APPLICATION NO.   : 12/374474
DATED             : March 29, 2011
INVENTOR(S)       : Takeyoshi Mimura, Akiya Kawaue and Ryoichi Takasu Page 1 of 1

It is certified that error appears in the above-identified patent and that said Letters Patent is hereby corrected as shown below:

At Column 1, Line 21-25, Below "pattern." delete "Priority is claimed on Japanese Patent Application No. 2006-201008, filed Jul. 24, 2006, Japanese Patent Application No. 2006-203629, filed Jul. 26, 2006, and Japanese Patent Application No. 2006-203630, filed Jul. 26, 2006, the contents of which are incorporated herein by reference.".

At Column 8, Line 45-46, Change "ethylnorbomene," to --ethylnorbornene,--.

At Column 38, Line 4, Change "e" to --$R^{41}$--. (First Occurrence)

At Column 38, Line 4, Change "e" to --$R^{41}$--. (Second Occurrence)

At Column 53, Line 64, Change "phosphoric" to --phosphonic--.

Signed and Sealed this
Twenty-seventh Day of September, 2011

David J. Kappos
*Director of the United States Patent and Trademark Office*